United States Patent
Weeks et al.

(10) Patent No.: US 12,191,160 B2
(45) Date of Patent: Jan. 7, 2025

(54) METHOD FOR MAKING A SEMICONDUCTOR SUPERLATTICES WITH DIFFERENT NON-SEMICONDUCTOR THERMAL STABILITIES

(71) Applicant: Atomera Incorporated, Los Gatos, CA (US)

(72) Inventors: Keith Doran Weeks, Chandler, AZ (US); Nyles Wynn Cody, Tempe, AZ (US); Marek Hytha, Brookline, MA (US); Robert J. Mears, Wellesley, MA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 629 days.

(21) Appl. No.: 17/305,192

(22) Filed: Jul. 1, 2021

(65) Prior Publication Data
US 2022/0005706 A1    Jan. 6, 2022

Related U.S. Application Data

(60) Provisional application No. 63/047,365, filed on Jul. 2, 2020.

(51) Int. Cl.
*H01L 21/00* (2006.01)
*H01L 21/02* (2006.01)
*H01L 21/322* (2006.01)

(52) U.S. Cl.
CPC .... *H01L 21/3225* (2013.01); *H01L 21/02507* (2013.01)

(58) Field of Classification Search
CPC .......... H01L 21/02507; H01L 21/3225; H01L 29/152
See application file for complete search history.

(56) References Cited

U.S. PATENT DOCUMENTS

| | | | |
|---|---|---|---|
| 4,937,204 A | 6/1990 | Ishibashi et al. | |
| 5,216,262 A | 6/1993 | Tsu | |
| | (Continued) | | |

FOREIGN PATENT DOCUMENTS

| | | |
|---|---|---|
| GB | 2347520 | 6/2000 |
| TW | 201820621 | 6/2018 |
| | (Continued) | |

OTHER PUBLICATIONS

Kal et al. "Selective isotropic etching of Group IV semiconductors to enable gate all around device architectures" TEL Technology Center, America, LLC Tel; SPPC, Apr. 10, 2018; pp. 17.
(Continued)

*Primary Examiner* — Reema Patel
(74) *Attorney, Agent, or Firm* — ALLEN, DYER, DOPPELT + GILCHRIST, P.A. Attorneys at Law

(57) ABSTRACT

A method for making a semiconductor device may include forming first and second superlattices adjacent a semiconductor layer. Each of the first and second superlattices may include stacked groups of layers, with each group of layers including stacked base semiconductor monolayers defining a base semiconductor portion and at least one non-semiconductor monolayer constrained within a crystal lattice of adjacent base semiconductor portions. The second superlattice may have a greater thermal stability with respect to non-semiconductor atoms therein than the first superlattice. The method may further include heating the first and second superlattices to cause non-semiconductor atoms from the first superlattice to migrate toward the at least one non-semiconductor monolayer of the second superlattice.

16 Claims, 24 Drawing Sheets

(56) References Cited

U.S. PATENT DOCUMENTS

| | | | |
|---|---|---|---|
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 9,558,939 B1 | 1/2017 | Stephenson et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 2003/0034529 A1 | 2/2003 | Fitzgerald et al. |
| 2003/0057416 A1 | 3/2003 | Currie et al. |
| 2005/0282330 A1 | 12/2005 | Mears et al. |
| 2006/0220118 A1 | 10/2006 | Stephenson et al. |
| 2006/0267130 A1 | 11/2006 | Rao |
| 2007/0012910 A1 | 1/2007 | Mears et al. |
| 2007/0020833 A1 | 1/2007 | Mears et al. |
| 2008/0012004 A1 | 1/2008 | Huang et al. |
| 2008/0258134 A1 | 10/2008 | Mears et al. |
| 2011/0215299 A1 | 9/2011 | Rao |
| 2014/0021587 A1* | 1/2014 | Harame ............ H01L 29/732 438/364 |
| 2015/0357414 A1 | 12/2015 | Mears |
| 2015/0380493 A1* | 12/2015 | Kawashima ...... H01L 21/02658 257/607 |
| 2016/0149023 A1 | 5/2016 | Mears et al. |
| 2016/0358773 A1 | 12/2016 | Mears et al. |
| 2018/0040724 A1 | 2/2018 | Mears et al. |
| 2018/0138106 A1 | 5/2018 | Venkatasubramanian et al. |
| 2019/0058059 A1 | 2/2019 | Stephenson et al. |
| 2019/0189652 A1 | 6/2019 | Chen et al. |
| 2019/0279869 A1 | 9/2019 | Weeks et al. |
| 2019/0279897 A1 | 9/2019 | Stephenson et al. |
| 2019/0317277 A1 | 10/2019 | Stephenson |
| 2019/0319135 A1 | 10/2019 | Stephenson |
| 2019/0319167 A1 | 10/2019 | Stephenson |
| 2020/0135489 A1 | 4/2020 | Weeks et al. |
| 2020/0343367 A1 | 10/2020 | Takeuchi et al. |
| 2020/0343380 A1 | 10/2020 | Takeuchi et al. |

FOREIGN PATENT DOCUMENTS

| | | |
|---|---|---|
| TW | 201831741 | 9/2018 |
| TW | 202016977 | 5/2020 |
| TW | 202025481 | 7/2020 |
| WO | 2015077580 | 5/2015 |

OTHER PUBLICATIONS

U.S. Appl. No. 16/513,825, filed 17/17/2019; Burton et al.
U.S. Appl. No. 16/513,832, filed 17/17/2019 Burton et al.
U.S. Appl. No. 16/513,875, filed 17/17/2019 Burton et al.
U.S. Appl. No. 16/513,906, filed 17/17/2019 Burton et al.
U.S. Appl. No. 16/801,287, filed Feb. 26, 2020 Weeks et al.
U.S. Appl. No. 16/801,305, filed Feb. 26, 2020 Weeks et al.
U.S. Appl. No. 16/810,957, filed Mar. 6, 2020 Cody et al.
U.S. Appl. No. 16/898,564, filed Jun. 11, 2020 Takeuchi et al.
U.S. Appl. No. 16/898,589, filed Jun. 11, 2020 Takeuchi et al.
U.S. Appl. No. 16/913,487, filed Jun. 26, 2020 Burton et al.
U.S. Appl. No. 16/913,546, filed Jun. 26, 2020 Burton et al.
U.S. Appl. No. 17/020,353, filed Sep. 14, 2020; Weeks et al.
U.S. Appl. No. 17/101,399, filed Nov. 23, 2020 Stephenson et al.
U.S. Appl. No. 17/236,289, filed Apr. 21, 2021 Hytha et al.
U.S. Appl. No. 17/236,329, filed Apr. 21, 2021 Hytha et al.
U.S. Appl. No. 17/305,098, filed Jun. 30, 2021 Weeks et al.
U.S. Appl. No. 17/305,101, filed Jun. 30, 2021 Weeks et al.
U.S. Appl. No. 17/330,831, filed May 26, 2021 Hytha et al.

(56) References Cited

OTHER PUBLICATIONS

U.S. Appl. No. 17/330,860, filed May 26, 2021 Hytha et al.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu "Phenomena in silicon nanostructure device" published online Sep. 6, 2000 by Applied Physics and Materials Science & Processing, pp. 391-402.
R. Tsu "Si Based Green ELD: Si-Oxygen Superlattice" ysiwyg://// http://www3.interscience.wiley.com/cgi-bin/abstract/72512946/ start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.

\* cited by examiner

| Run # | Total Ox | | | Bottom Ox | | | Oxygen Peak | | Middle Ox | | | Top Ox | | |
|---|---|---|---|---|---|---|---|---|---|---|---|---|---|---|
| | At/cm^2 | Loss | Loss % | At/cm^2 | Loss | Loss % | At/cm^3 | At/cm^2 | Gain | Gain % | At/cm^2 | Loss | Loss % |
| 5063 | 6.02E+15 | | | 2.83E+15 | | | 1.50E+21 | 6.69E+14 | | | 2.53E+15 | | |
| 5064 | 4.42E+15 | 1.60E+15 | 27 | 2.05E+15 | 7.80E+14 | 28 | 3.00E+21 | 1.41E+15 | 7.41E+14 | 111 | 9.72E+14 | 1.56E+15 | 62 |

| Run # | Total Ox | | | Bottom Ox | | | Oxygen Peak | | Middle Ox | | Top Ox | | |
|---|---|---|---|---|---|---|---|---|---|---|---|---|---|
| | At/cm^2 | Loss | Loss % | At/cm^2 | Loss | Loss % | At/cm^3 | At/cm^2 | Gain | Gain % | At/cm^2 | Loss | Loss % |
| 5063 | 6.02E+15 | | | 2.83E+15 | | | 1.50E+21 | 6.69E+14 | | | 2.53E+15 | | |
| 5064 | 4.42E+15 | 1.60E+15 | 27 | 2.05E+15 | 7.80E+14 | 28 | 3.00E+21 | 1.41E+15 | 7.41E+14 | 111 | 9.72E+14 | 1.56E+15 | 62 |
| 5114 | 4.46E+15 | 1.56E+15 | 26 | 1.92E+15 | 9.10E+14 | 32 | 3.39E+21 | 1.36E+15 | 6.91E+14 | 103 | 1.19E+15 | 1.34E+15 | 53 |

| Run # | Total Ox | | | Bottom Ox | | | Oxygen Peak | | Middle Ox | | Top Ox | | |
|---|---|---|---|---|---|---|---|---|---|---|---|---|---|
| | At/cm^2 | Loss | Loss % | At/cm^2 | Loss | Loss % | At/cm^3 | At/cm^2 | Gain | Gain % | At/cm^2 | Loss | Loss % |
| 5063 | 6.02E+15 | | | 2.83E+15 | | | 1.50E+21 | 6.69E+14 | | | 2.53E+15 | | |
| 5064 | 4.42E+15 | 1.60E+15 | 27 | 2.05E+15 | 7.80E+14 | 28 | 3.00E+21 | 1.41E+15 | 7.41E+14 | 111 | 9.72E+14 | 1.56E+15 | 62 |
| 5111 | 4.29E+15 | 1.73E+15 | 29 | 2.62E+15 | 2.10E+14 | 7 | 1.63E+21 | 6.06E+14 | -6.30E+13 | -9 | 1.08E+15 | 1.45E+15 | 57 |
| 5112 | 3.37E+15 | 9.20E+14 | 21 | 1.79E+15 | 8.30E+14 | 32 | 2.95E+21 | 1.25E+15 | 6.44E+14 | 106 | 2.57E+14 | 8.23E+14 | 76 |

FIG. 12

| Run # | Total Ox | | | Bottom Ox | | | Oxygen Peak | | Middle Ox | | Top Ox | | |
|---|---|---|---|---|---|---|---|---|---|---|---|---|---|
| | At/cm^2 | Loss | Loss % | At/cm^2 | Loss | Loss % | At/cm^3 | At/cm^2 | Gain | Gain % | At/cm^2 | Loss | Loss % |
| 5063 | 6.02E+15 | | | 2.83E+15 | | | 1.50E+21 | 6.69E+14 | | | 2.53E+15 | | |
| 5064 | 4.42E+15 | 1.60E+15 | 27 | 2.05E+15 | 7.80E+14 | 28 | 3.00E+21 | 1.41E+15 | 7.41E+14 | 111 | 9.72E+14 | 1.56E+15 | 62 |
| 5113 | 3.50E+15 | 7.90E+14 | 18 | 1.87E+15 | 7.50E+14 | 29 | 3.06E+21 | 1.26E+15 | 6.54E+14 | 108 | 3.86E+14 | 6.94E+14 | 64 |
| 5114 | 4.46E+15 | 1.56E+15 | 26 | 1.92E+15 | 9.10E+14 | 32 | 3.39E+21 | 1.36E+15 | 6.91E+14 | 103 | 1.19E+15 | 1.34E+15 | 53 |

FIG. 13

| H2 Time Sec | Total Ox | | | Bottom Ox | | | Oxygen Peak | | Middle Ox | | Top Ox | | |
|---|---|---|---|---|---|---|---|---|---|---|---|---|---|
| | At/cm^2 | Loss | Loss % | At/cm^2 | Loss | Loss % | At/cm^3 | At/cm^2 | Gain | Gain % | At/cm^2 | Loss | Loss % |
| 300 | 4.42E+15 | 1.60E+15 | 27 | 2.05E+15 | 7.80E+14 | 28 | 3.00E+21 | 1.41E+15 | 7.41E+14 | 111 | 9.72E+14 | 1.56E+15 | 62 |
| 300 | 4.46E+15 | 1.56E+15 | 26 | 1.92E+15 | 9.10E+14 | 32 | 3.39E+21 | 1.36E+15 | 6.91E+14 | 103 | 1.19E+15 | 1.34E+15 | 53 |
| 600 | 3.96E+15 | 2.06E+15 | 34 | 1.70E+15 | 1.13E+15 | 40 | 3.40E+21 | 1.43E+15 | 7.61E+14 | 114 | 8.40E+14 | 1.69E+15 | 67 |
| 150 | 4.80E+15 | 1.22E+15 | 20 | 2.04E+15 | 7.90E+14 | 28 | 3.30E+21 | 1.33E+15 | 6.61E+14 | 99 | 1.44E+15 | 1.09E+15 | 43 |

| | | | Oxygen | | | | | | | | | | | |
|---|---|---|---|---|---|---|---|---|---|---|---|---|---|---|
| Run | Total Ox | | | Bottom Ox | | | | Peak | | Middle Ox | | | Top Ox | | |
| # | At/cm^2 | Loss | Loss % | At/cm^2 | Loss | Loss % | At/cm^3 | At/cm^2 | Gain | Gain % | At/cm^2 | Loss | Loss % |
| 5064 | 4.42E+15 | 1.60E+15 | 27 | 2.05E+15 | 7.80E+14 | 28 | 3.00E+21 | 1.41E+15 | 7.41E+14 | 111 | 9.72E+14 | 1.56E+15 | 62 |
| 5114 | 4.46E+15 | 1.56E+15 | 26 | 1.92E+15 | 9.10E+14 | 32 | 3.39E+21 | 1.36E+15 | 6.91E+14 | 103 | 1.19E+15 | 1.34E+15 | 53 |
| 5115 | 4.47E+15 | 1.55E+15 | 26 | 1.88E+15 | 9.50E+14 | 34 | 3.49E+21 | 1.48E+15 | 8.11E+14 | 121 | 1.16E+15 | 1.37E+15 | 54 |

| Run | Total Nitrogen | | | Bottom N | | | Peak | | Middle N | | | Top N | | |
|---|---|---|---|---|---|---|---|---|---|---|---|---|---|---|
| # | At/cm^2 | Loss | Loss % | At/cm^2 | Loss | Loss % | At/cm^3 | At/cm^2 | Gain | Gain % | At/cm^2 | Loss | Loss % |
| 5064 | x | x | x | x | x | x | x | x | x | x | x | x | x |
| 5114 | x | x | x | x | x | x | x | x | x | x | x | x | x |
| 5115 | 3.87E+14 | x | x | 1.80E+14 | x | x | 1.37E+20 | 9.16E+13 | x | x | 1.19E+14 | x | x |

| Run # | Total Ox At/cm^2 | Total Ox Loss | Total Ox Loss % | Bottom Ox At/cm^2 | Bottom Ox Loss | Bottom Ox Loss % | Peak At/cm^3 | Middle Ox At/cm^2 | Middle Ox Gain | Middle Ox Gain % | Top Ox At/cm^2 | Top Ox Loss | Top Ox Loss % |
|---|---|---|---|---|---|---|---|---|---|---|---|---|---|
| 5114 | 4.46E+15 | 1.56E+15 | 26 | 1.92E+15 | 9.10E+14 | 32 | 3.39E+21 | 1.36E+15 | 6.91E+14 | 103 | 1.19E+15 | 1.34E+15 | 53 |
| 5115 | 4.47E+15 | 1.55E+15 | 26 | 1.88E+15 | 9.50E+14 | 34 | 3.49E+21 | 1.48E+15 | 8.11E+14 | 121 | 1.16E+15 | 1.37E+15 | 54 |
| 5149 | 3.96E+15 | 2.06E+15 | 34 | 1.69E+15 | 1.14E+15 | 40 | 3.19E+21 | 1.33E+15 | 6.61E+14 | 99 | 9.93E+14 | 1.54E+15 | 61 |
| 5150 | 2.15E+15 | 3.87E+15 | 64 | 8.82E+14 | 1.95E+15 | 69 | 2.46E+21 | 1.05E+15 | 3.81E+14 | 57 | 2.39E+14 | 2.29E+15 | 91 |

| Total Nitrogen At/cm^2 | Loss | Loss % | Bottom N At/cm^2 | Loss | Loss % | Peak At/cm^3 | Middle N At/cm^2 | Gain | Gain % | Top N At/cm^2 | Loss | Loss % |
|---|---|---|---|---|---|---|---|---|---|---|---|---|
| x | x | x | x | x | x | x | x | x | x | x | x | x |
| 3.87E+14 | x | x | 1.80E+14 | x | x | 1.37E+20 | 9.16E+13 | x | x | 1.19E+14 | x | x |
| 5.90E+14 | x | x | 2.89E+14 | x | x | 2.81E+20 | 1.28E+14 | x | x | 1.81E+14 | x | x |
| 5.41E+14 | x | x | 3.12E+14 | x | x | 3.70E+20 | 1.66E+14 | x | x | 6.97E+13 | x | x |

FIG. 18

| Run # | M6 Time Sec | M6 Flow Sccm | Total Ox At/cm^2 | Total Ox Loss | Total Ox Loss % | Bottom Ox At/cm^2 | Bottom Ox Loss | Bottom Ox Loss % | Oxygen Peak At/cm^3 | At/cm^2 | Middle Ox Gain | Middle Ox Gain % | Top Ox At/cm^2 | Top Ox Loss | Top Ox Loss % |
|---|---|---|---|---|---|---|---|---|---|---|---|---|---|---|---|
| 5063 | 13 | 80 | 6.02E+15 | | | 2.83E+15 | | | 1.50E+21 | 6.69E+14 | | | 2.53E+15 | | |
| 5064 | 13 | 80 | 4.42E+15 | 1.60E+15 | 27 | 2.05E+15 | 7.80E+14 | 28 | 3.00E+21 | 1.41E+15 | 7.41E+14 | 111 | 9.72E+14 | 1.56E+15 | 62 |
| 5114 | 13 | 80 | 4.46E+15 | 1.56E+15 | 26 | 1.92E+15 | 9.10E+14 | 32 | 3.39E+21 | 1.36E+15 | 6.91E+14 | 103 | 1.19E+15 | 1.34E+15 | 53 |
| 5153 | 19 | 80 | 5.53E+15 | | | 2.56E+15 | | | 2.58E+21 | 8.69E+14 | | | 2.13E+15 | | |
| 5154 | 19 | 80 | 4.36E+15 | 1.17E+15 | 21 | 1.67E+15 | 8.90E+14 | 49 | 5.55E+21 | 1.91E+15 | 1.04E+15 | 120 | 7.90E+14 | 1.34E+15 | 63 |

FIG. 20

METHOD FOR MAKING A SEMICONDUCTOR SUPERLATTICES WITH DIFFERENT NON-SEMICONDUCTOR THERMAL STABILITIES

RELATED APPLICATIONS

This application claims the benefit of U.S. provisional application Ser. No. 63/047,365 filed Jul. 2, 2020, which is hereby incorporated herein in its entirety by reference.

TECHNICAL FIELD

The present disclosure generally relates to semiconductor devices, and, more particularly, to methods for making semiconductor devices with enhanced semiconductor materials and associated methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming first and second superlattices adjacent a semiconductor layer. Each of the first and second superlattices may include a plurality of stacked groups of layers, with each group of layers including a plurality of stacked base semiconductor monolayers defining a base semiconductor portion and at least one non-semiconductor monolayer constrained within a crystal lattice of adjacent base semiconductor portions. The second superlattice may have a greater thermal stability with respect to non-semiconductor atoms therein than the first superlattice. The method may further include heating the first and second superlattices to cause non-semiconductor atoms from the first superlattice to migrate toward the at least one non-semiconductor monolayer of the second superlattice.

In an example embodiment, the first superlattice may be below the second superlattice, and the method may further include forming a third superlattice above the second superlattice, which is similar to the first and second superlattices described briefly above. Moreover, the second superlattice may have a greater thermal stability with respect to non-semiconductor atoms than the third superlattice.

The method may also include forming a semiconductor layer above the first and second superlattices at a temperature of at least 1000° C. and for a time period of at least thirty seconds, for example. Also by way of example, the semiconductor layer may have a thickness of at least 500 nm.

In an example implementation, forming the second superlattice may comprise forming the second superlattice at a temperature above 600° C. In accordance with another example, forming the first superlattice may comprise forming the first superlattice at a temperature below 600° C. In some embodiments, the method may also include forming a semiconductor cap layer above the first and second superlattices. By way of example, heating may comprise annealing in an ambient comprising at least one of hydrogen, nitrogen, helium, and argon. Also by way of example, the at least one non-semiconductor monolayer may comprise oxygen, and the base semiconductor layers may comprise silicon.

BRIEF DESCRIPTION OF THE DRAWINGS

FIG. 9 is a table of various oxygen concentrations corresponding to the graph of FIG. 8.

FIG. 11 is a table of various oxygen concentrations corresponding to the graph of FIG. 10.

FIG. 12 is a table of various oxygen concentrations corresponding to an example implementation of the method FIG. 7.

FIG. 13 is a table of various oxygen concentrations corresponding to an example implementation of the method FIG. 7 including native oxide growth and an $H_2$ anneal.

FIG. 14 is a table of various oxygen concentrations corresponding to an example implementation of the method FIG. 7 including a post growth $H_2$ anneal.

FIG. 17 is a table of various oxygen concentrations corresponding to an example implementation of the method FIG. 7 including $H_2$ and $N_2$ anneals.

FIG. 18 is a table of various oxygen concentrations corresponding to an example implementation of the method FIG. 7 including $H_2+N_2+H_2$ anneals.

FIG. 20 is a table of various oxygen concentrations corresponding to an example implementation of the method FIG. 7 with an increased oxygen dosing time.

DETAILED DESCRIPTION

Figure 1:
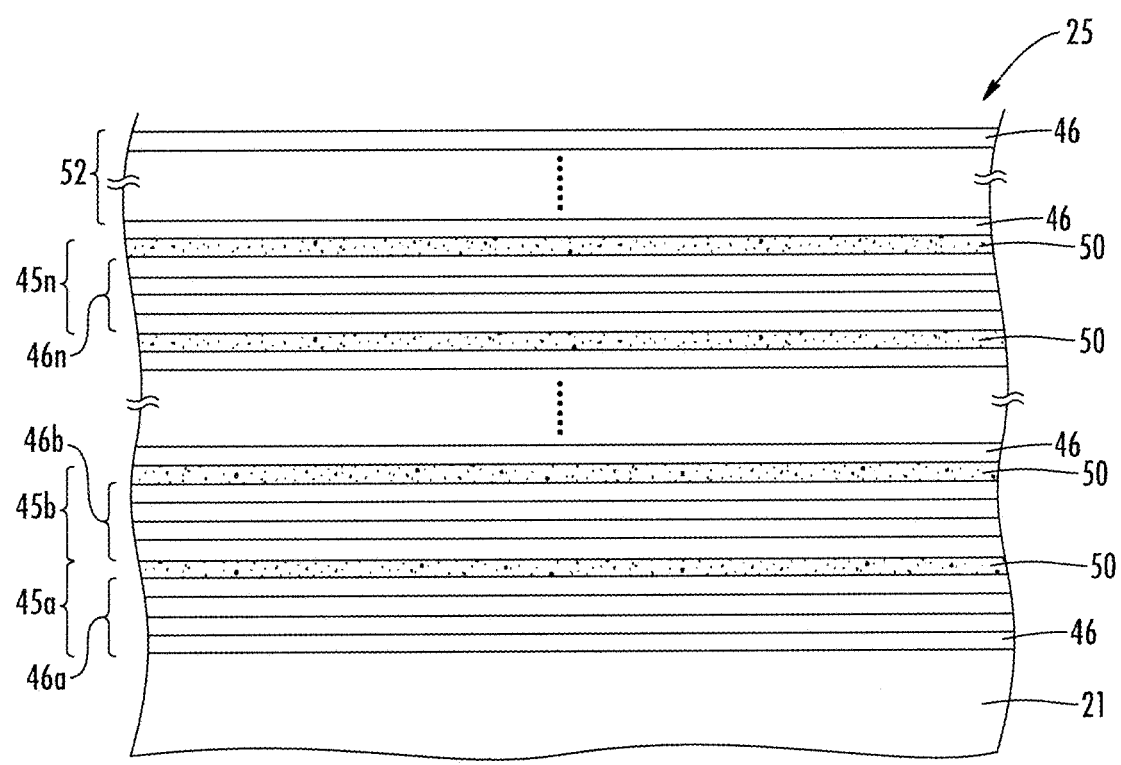
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of semiconductor devices utilizing an enhanced semiconductor superlattice. The enhanced semiconductor superlattice may also be referred to as an "MST" layer/film or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum\limits_{E>E_F} \int\limits_{B.Z.} (\nabla_k E(k,n))_i (\nabla_k E(k,n))_j \frac{\partial f(E(k,n), E_F, T)}{\partial E} d^3k}{\sum\limits_{E>E_F} \int\limits_{B.Z.} f(E(k,n), E_F, T) d^3k}$$

for electrons and:

$$M_{h,ij}^{-1}(E_F, T) = \frac{-\sum\limits_{E<E_F} \int\limits_{B.Z.} (\nabla_k E(k,n))_i (\nabla_k E(k,n))_j \frac{\partial f(E(k,n), E_F, T)}{\partial E} d^3k}{\sum\limits_{E<E_F} \int\limits_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
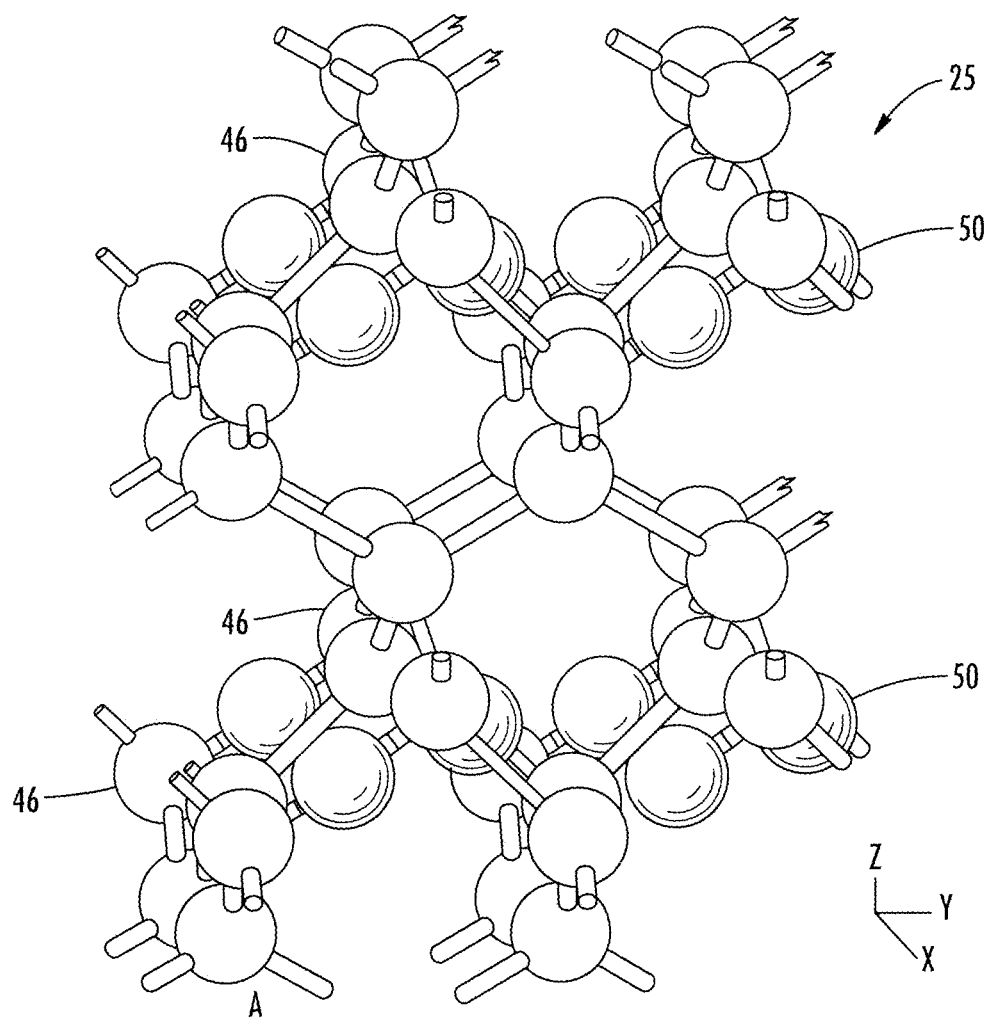
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation on a substrate 21, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy and structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. By way of example, the cap layer 52 may have between 1 to 100 monolayers 46 of the base semiconductor, and, more preferably between 10 to 50 monolayers. However, in some applications the cap layer 52 may be omitted, or thicknesses greater than 100 monolayers may be used.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
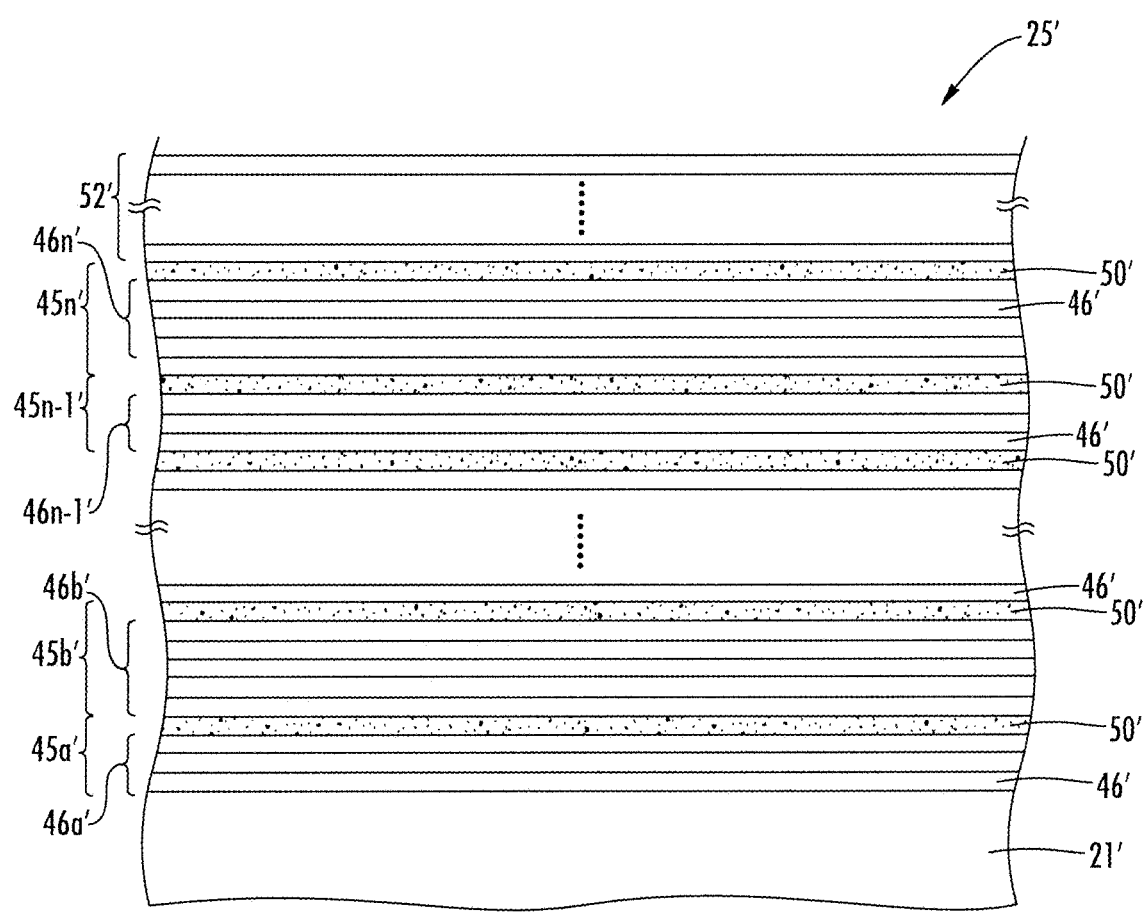
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 on a substrate 21' is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
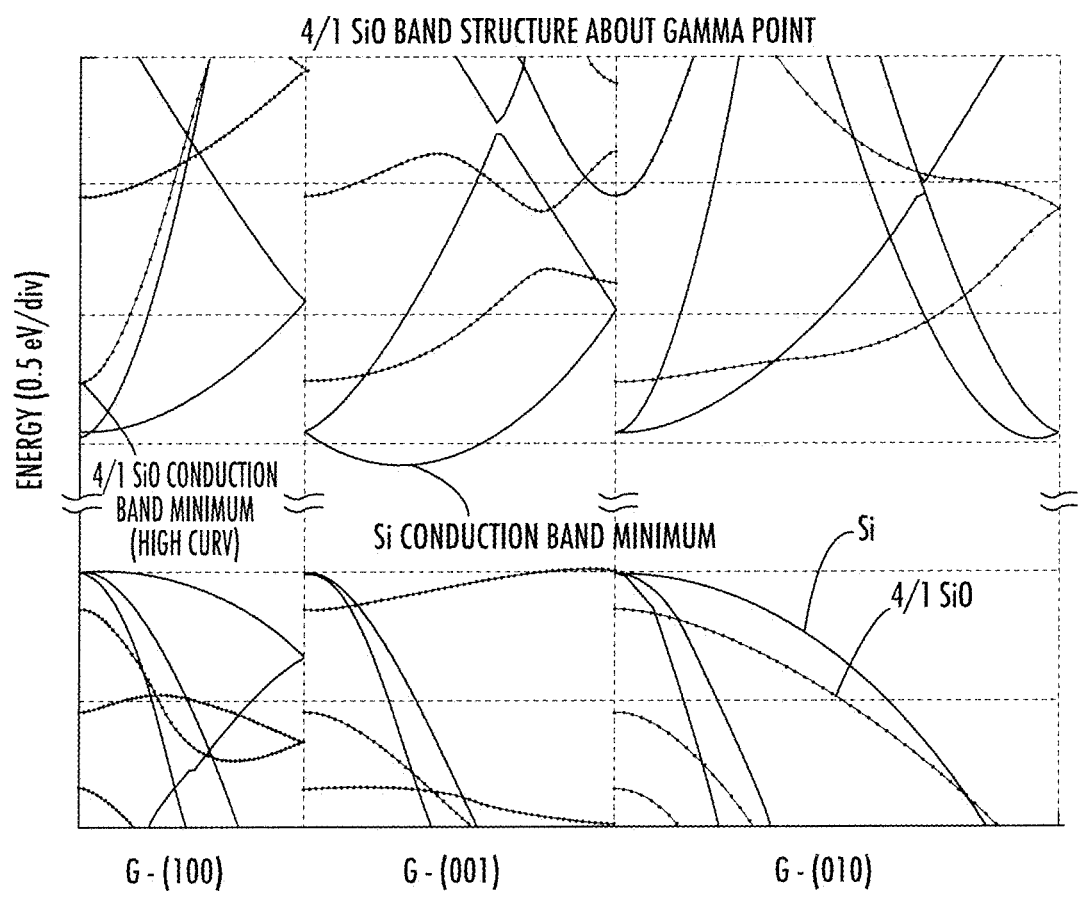
FIG. 4A is a graph of the calculated band structure from the gamma point (G) for both bulk silicon as in the prior art, and for the 4/1 Si/O superlattice as shown in FIGS. 1-2.
Figure 4B:
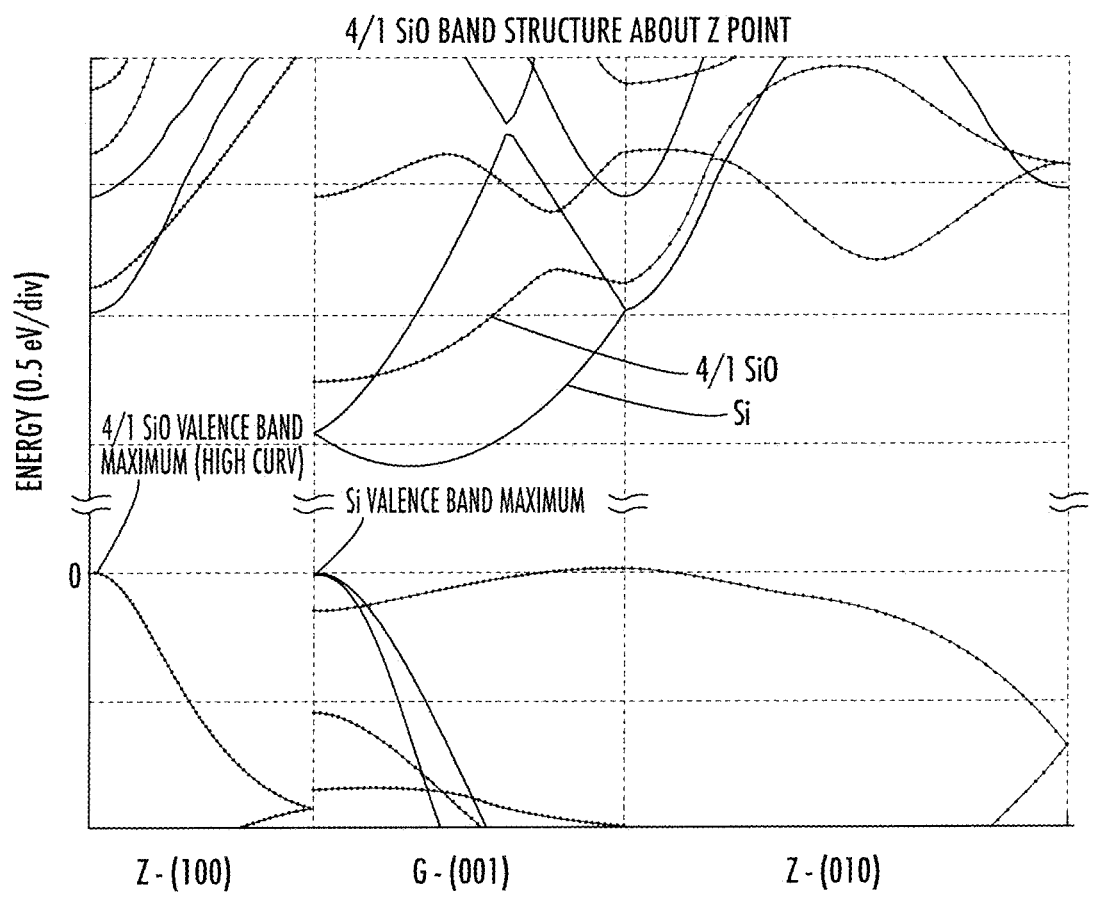
FIG. 4B is a graph of the calculated band structure from the Z point for both bulk silicon as in the prior art, and for the 4/1 Si/O superlattice as shown in FIGS. 1-2.
Figure 4C:
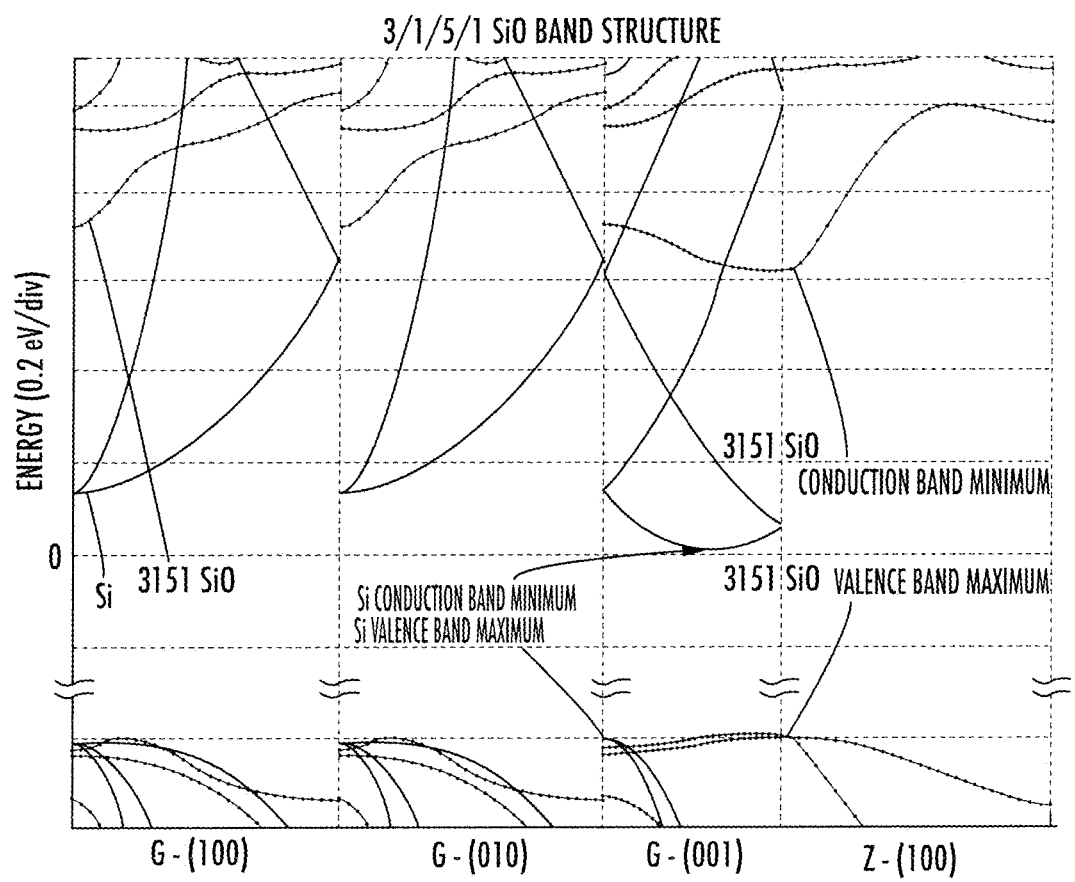
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
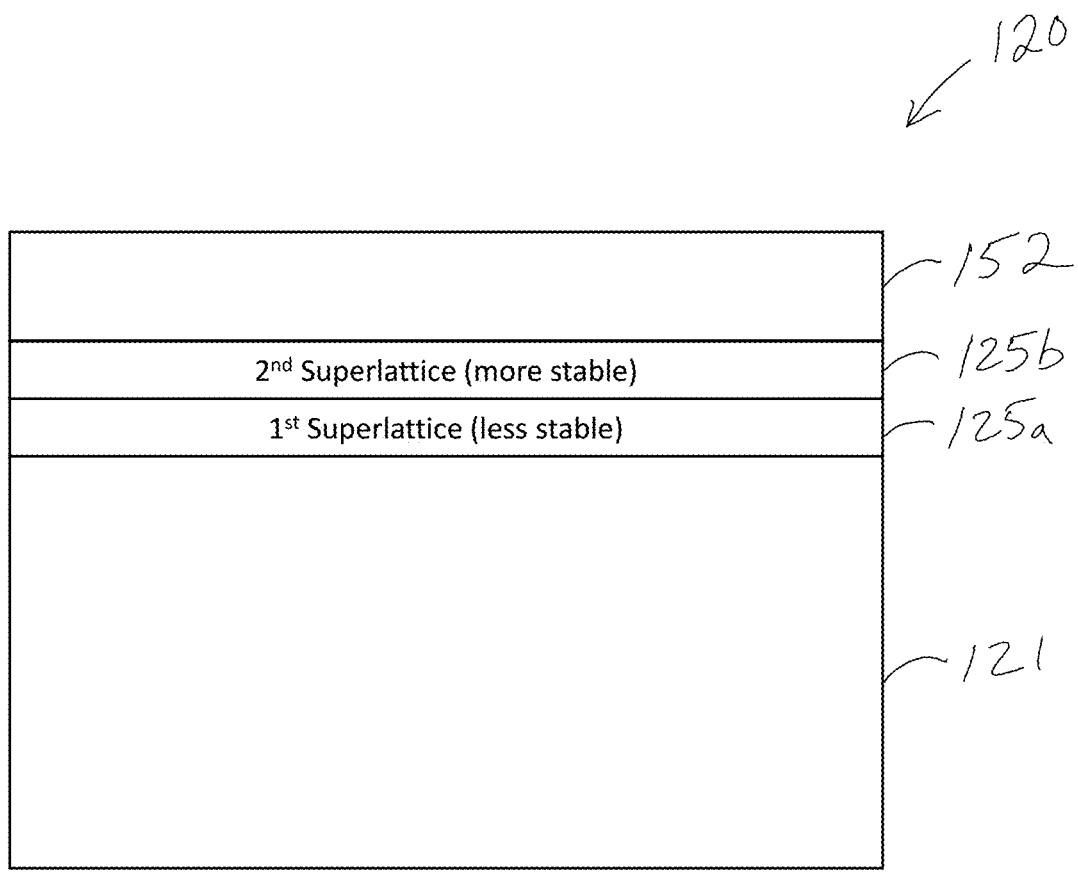
FIGS. 5 and 6 are schematic cross-sectional views of semiconductor devices fabricated in accordance with an example method using superlattices with different non-semiconductor thermal stabilities.

Using the above-described techniques, advanced semiconductor devices may be fabricated in which MST layers of different configurations are used to cause non-semiconductor atoms from one or more superlattices to migrate toward another superlattice(s) to increase the number of non-semiconductor atoms therein after the superlattices have been deposited. In one example implementation illustrated with reference to the semiconductor device 120 of FIG. 5, this process involves depositing a first "less stable" superlattice layer 125a (with respect to thermal stability of the non-semiconductor material) on a substrate 121, followed by a second "more stable" superlattice layer 125 on top of the less stable superlattice layer. A cap layer 152 is formed on the second superlattice 125b, and the layers are then heated to cause non-semiconductor atoms from the first superlattice 125a to migrate toward the non-semiconductor monolayer (s) of the second superlattice 125b.

Figure 6:
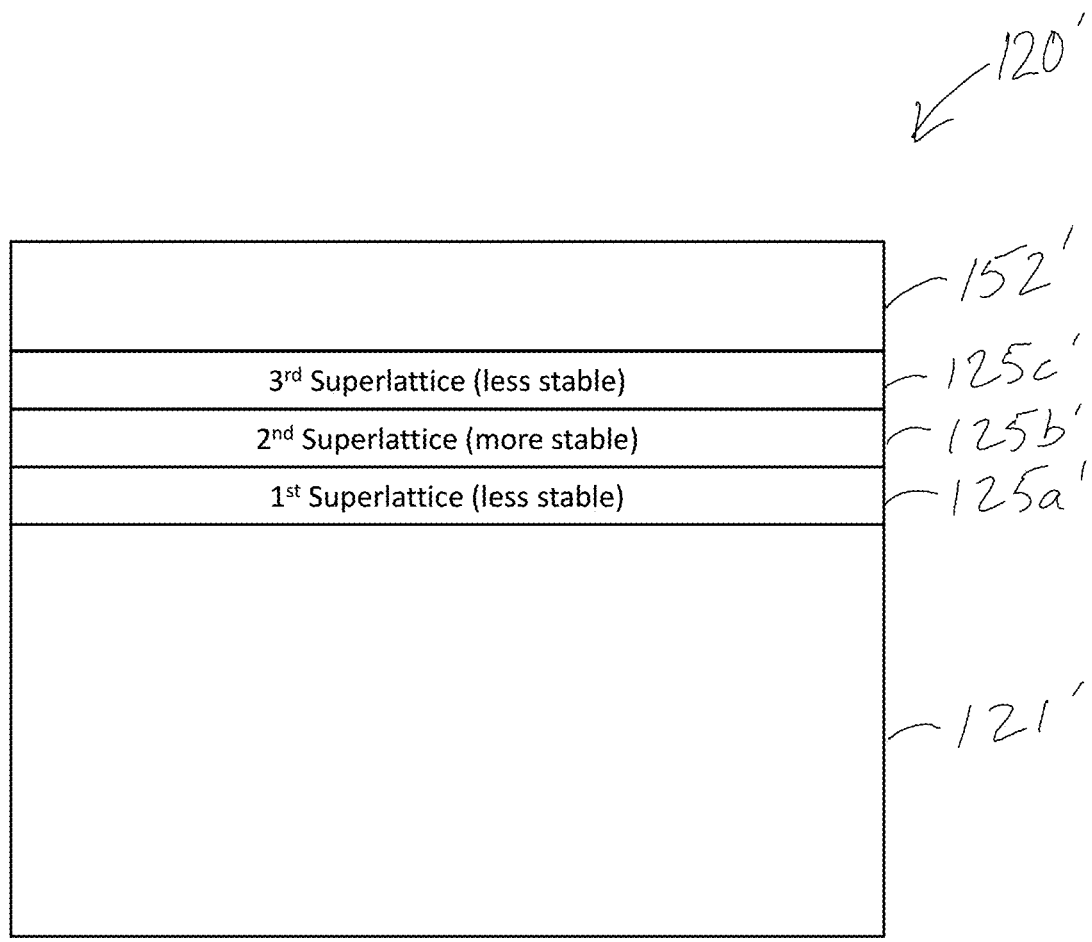
Figure 7:
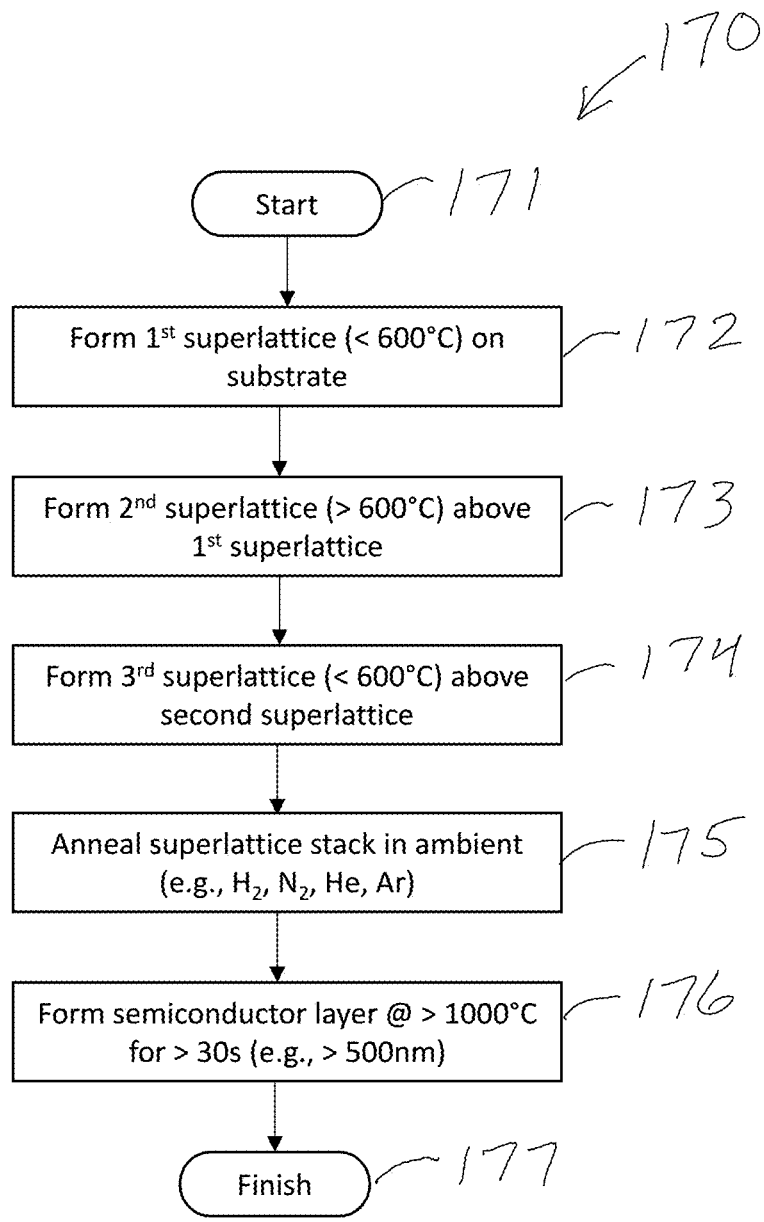
FIG. 7 is a flow diagram illustrating method steps associated with fabrication of the device of FIG. 6 in accordance with an example embodiment.

Referring additionally to FIG. 6 and the flow diagram 170 of FIG. 7, beginning at Block 171, in an alternative embodiment first and third less stable superlattices 125a', 125c' are formed on either side of the second more stable superlattice layer 12b' (i.e., the second superlattice is positioned between the first and third superlattice layers in a vertical stack as shown), at Blocks 172-174. More particularly, oxygen dosed MST layers that are dosed at temperatures below 600° C. are generally more ideal (planar) in arrangement as compared to oxygen dosed MST layers dosed at temperatures above 600° C., which are more prone to forming oxygen platelets or clusters (assuming all other process conditions equal).

In this regard, "planar" means that the oxygen atoms absorb more uniformly into the silicon subsurface sites in nearly all of the ideal sites between the silicon atoms, as opposed to agglomerating into platelet islands. However, oxygen bound in these planar-like structures are oftentimes less stable to thermal anneals than the oxygen agglomerated into platelets. It should be noted that other factors may also effect stability, such as monolayer dose and spacing between monolayers.

After forming the second superlattice 125b' which is a more stable MST layer embedded between the less stable MST layers 125a', 125c', the entire stack of superlattice layers is annealed, at Block 175. By way of example, this annealing may take place in an ambient of $H_2$, $N_2$, He, Ar, etc. The ambient may include other gasses as well. During the anneal, the oxygen undergoes a diffusion process like spinodal decomposition, such that oxygen atoms diffuse up the concentration gradient to define an accumulation of oxygen atoms at the location of the second (more stable) MST layer 125b', thereby causing the second superlattice to have additional oxygen atoms than were originally deposited during its formation, and thereby provide enhanced insulating properties, similar to a buried insulating layer. This process advantageously allows the superlattices 125, 125' to have a higher oxygen concentration, yet without the associated defects that would otherwise occur if one were to try and deposit this higher amount of oxygen between epitaxial growth of the base semiconductor portions 46a-46n. That is, attempts to directly grow an MST layer with such a heightened concentration of oxygen may otherwise result in an undesirably high defect level.

Although the examples noted above are described in terms of one or two less stable MST layers adjacent one more stable MST layer, it will be appreciated by the skilled artisan that other numbers of more/less stable superlattices may be used in different embodiments. Moreover, while the examples are presented in terms of silicon and oxygen, other semiconductor and non-semiconductor materials may also be used, as discussed further above. For example, in some embodiments nitrogen may be used to help stabilize oxygen in desired locations, as will be discussed further below. Furthermore, multiple different stacks of MST layers may be located at different positions to define more than one embedded insulating layer in some embodiments.

The method of FIG. 7 further illustratively includes forming a relatively thick cap layer (e.g., 500 nm or more) through a high temperature growth process, e.g., at greater than 1000° C. for greater than thirty seconds, and more particularly at a temperature of 1100° C. for a minute or longer (Block 176). Such thicknesses are common in certain semiconductor processes, and the superlattices 125b, 125b' are advantageously able to withstand such high temperature processes for the requisite durations, whereas MST layers formed using typical recipes may be less likely to withstand such high temperature processing for these durations. The method of FIG. 7 illustratively concludes at Block 177, though further processing operations may typically be performed at this point to fabricate final devices such as those described further below.

Turning to FIGS. 8-22, the results of various MST film fabrication runs using the method illustrated in FIG. 7 are now described. As will be discussed further below, in the following examples different film recipes or configurations were used in different runs. For example, these may correspond to different numbers of repeating groups of layers, different numbers of semiconductor monolayers in the groups (e.g., 4/1, 3/1-5/1, 10/1, etc.), and/or different types of semiconductor and/or non-semiconductor materials in the different MST layers, as will be discussed further below with respect to various fabrication examples. Moreover, in the following examples etch-back processing was used to fabricate the MST films with reduced defects. Further details on this etch-back processing are set forth in U.S. Pat Nos. 10,566,191 and 10,811,498, which are assigned to the present Applicant and hereby incorporated herein in their entireties by reference. In the following examples, MST films formed using this etch-back process are referred to as "MEGA" MST layers.

Figure 8:
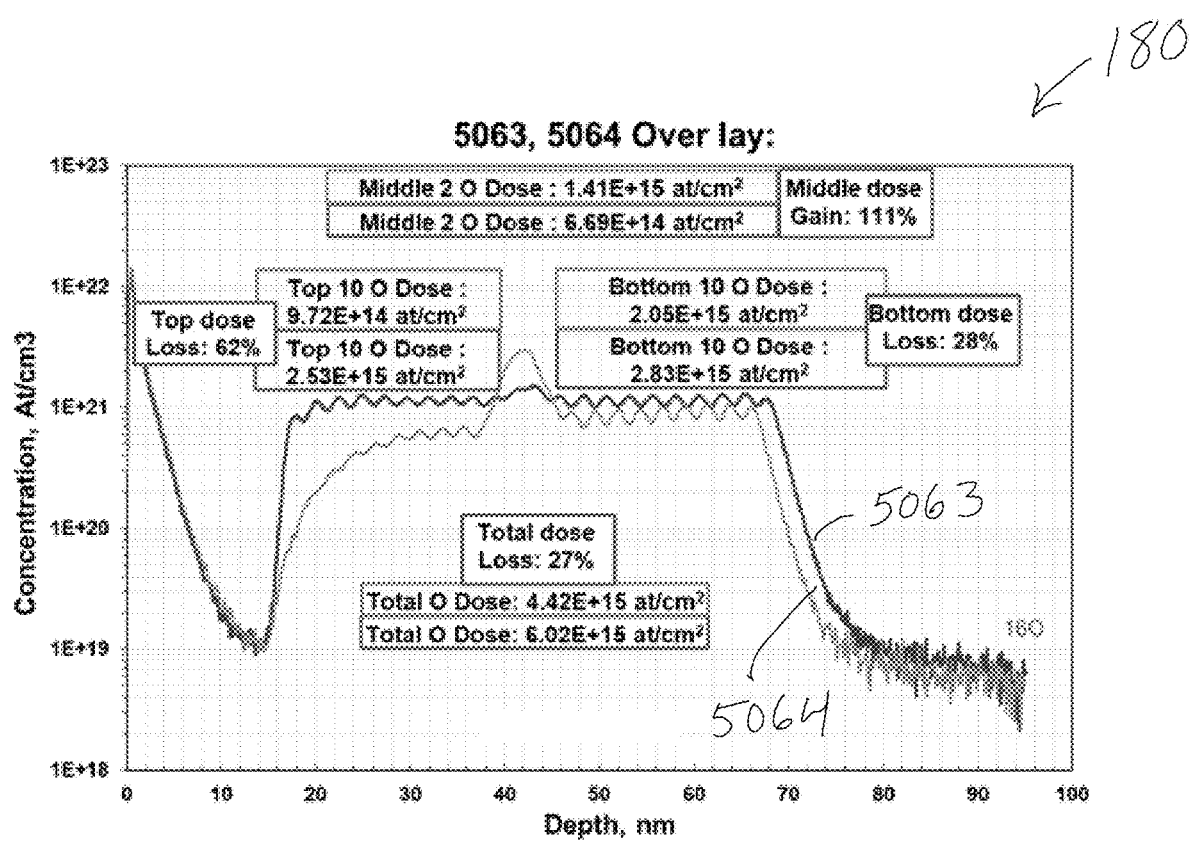
FIG. 8 is a graph of atom concentration vs. depth for semiconductor devices fabricated in accordance with a prior approach and also in accordance with the method of FIG. 7 in one example embodiment.

Referring initially to the graph 180 of FIG. 8 and the table 182 of FIG. 9, in a first example embodiment of the structure shown in FIG. 6, a series of MEGA1 (10/1)+MEGA6 (2/1)+MEGA1 (10/1) MST layers were grown with a 175 Å silicon cap. The stack was annealed in an $H_2$ ambient at 1000° C. for five minutes. A post growth anneal of the entire stack including the cap layer was also performed in an $N_2$ ambient at 900° C. MEGA6 is an example of an MST process that tends to form more stable platelet-like MST layers, whereas MEGA1 is an example an MST process that tends toward a more ideal planar-like (less thermally stable) MST layer. In the graph 180, the plot 5063 shows the concentration of oxygen ($^{16}O$) in the MEGA6 MST film prior to annealing, and the plot 5064 shows the oxygen concentration after the $H_2$ post growth $H_2$ anneal. This fabrication run confirmed that oxygen advantageously agglomerated on the MEGA6 layers resulting in 2.1× increase in oxygen in the MEGA6 layers (at a depth of about 44 nm in FIG. 8) as a result of the gathering of some of the lost oxygen from the MEGA1 layers.

Figure 10:
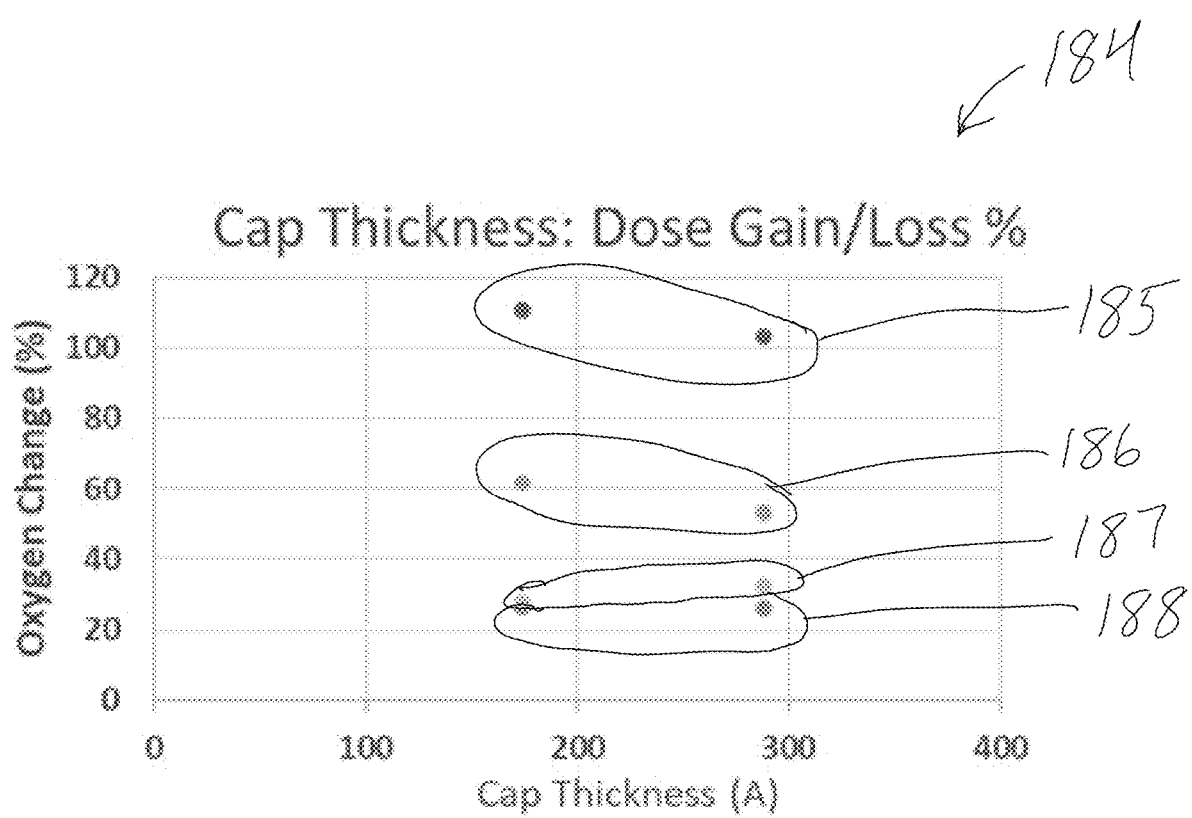
FIG. 10 is a graph of oxygen change vs. cap thickness in accordance with an example implementation of the method of FIG. 7.
Figure 15:
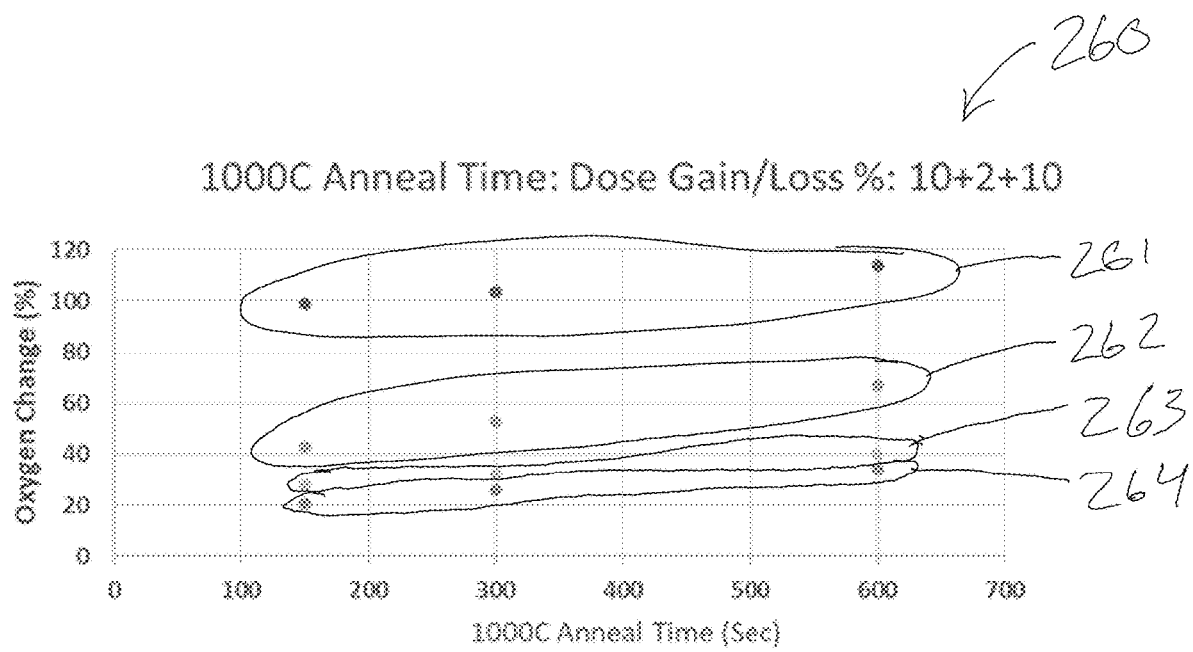
FIGS. 15 and 16 are graphs of oxygen change vs. anneal time corresponding to the approach of FIG. 14.
Figure 16:
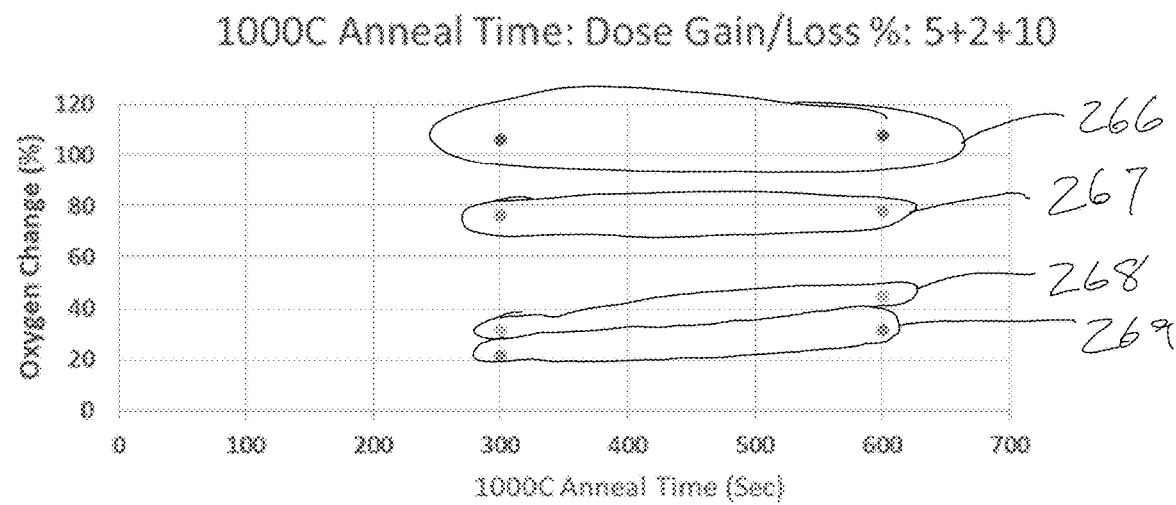
Figure 19:
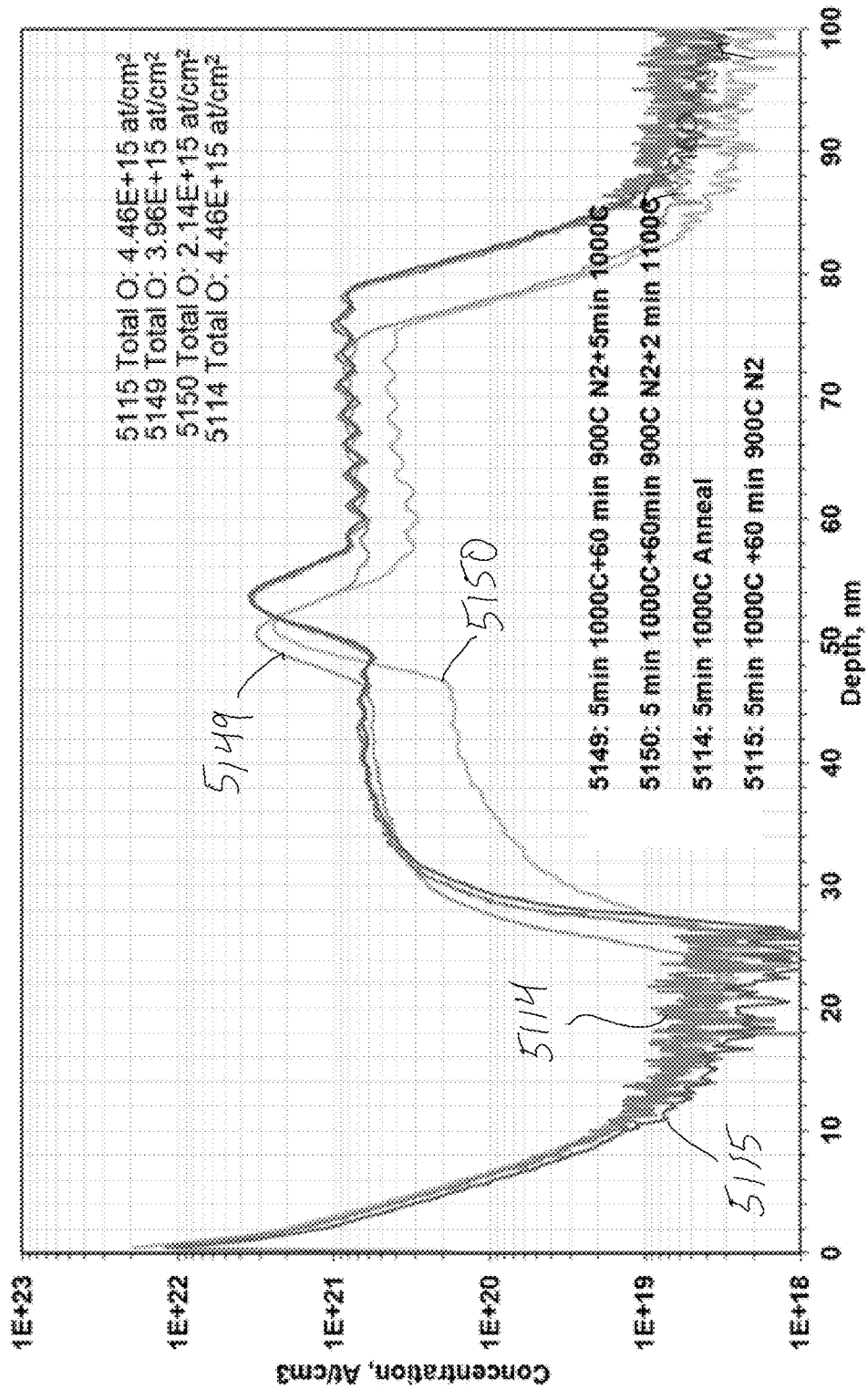
FIG. 19 is a graph of atom concentration vs. depth corresponding to the approach of FIG. 18.

Referring additionally to the graph 184 of FIG. 10 and the associated table 186 of FIG. 11, in another example embodiment of the structure shown in FIG. 6, a series of MEGA1 (10/1)+MEGA6 (2/1)+MEGA1 (10/1) MST layers were grown, but the silicon cap was increased in thickness to 290 Å. Furthermore, a post-growth anneal was performed at 1000° C. for 300 seconds. The graph 184 illustrates center MST film dose loss points 185, top MST film dose loss points 186, bottom MST film dose loss points 187, and total MST film dose loss points 188 for both of the 175 Å and 290 Å cap thicknesses. It will be noted that the center peak of interest has less dose gain with a thicker cap layer (111% versus 103% gain). Moreover, the total dose with the two cap thicknesses are similar (26% versus 27% loss). These results are further represented in the table 186.

Turning to the table 190 of FIG. 12, a similar process run was performed to that represented in FIG. 11, but with the change that the top MEGA1 stack was reduced by five cycles (i.e., a stack of MEGA1 (10/1)+MEGA6 (2/1)+MEGA1 (5/1) MST layers+290 Å cap). This resulted in a baseline middle MST layer dose that was 9% lower, even though the MEGA6 layers were not modified. Assuming the difference was not a secondary ion mass spectroscopy (SIMS) error, then reducing the number of top layers to five cycles did not significantly reduce the oxygen dose gain in the middle MEGA6 layers.

Turning to the table 192 of FIG. 13, a similar process run was performed to that represented in FIG. 11, but with the inclusion of native oxide growth before the post growth $H_2$ anneal (i.e., a stack of MEGA1 (10/1)+MEGA6 (2/1)+ MEGA1 (10/1) MST layers+290 Å cap). More particularly, in the illustrated run 5113, the wafer was unloaded and native oxide was allowed to form for one day before a five minute 1000° C. anneal. The result was a lower middle MST film dose gain than the thin cap annealed baseline 5064, but a 5% greater dose than the thick cap annealed sample (5114) set forth above. In other words, native oxide growth before an anneal was found to have a relatively small impact on the process.

Turning to the table 194 of FIG. 14, a similar process run was performed to that represented in FIG. 11, but with a series of post growth $H_2$ anneals at 1000° C. for 300, 150, and 600 seconds (i.e., a stack of MEGA1 (10/1)+MEGA6 (2/1)+MEGA1 (10/1) MST layers+290 Å cap). As seen in table 194, this fabrication run demonstrated that the peak oxygen dose still increases after ten minutes of annealing. Moreover, the peak oxygen concentration was increased by 10% after the longest anneal time. These results will be further understood with reference to the graphs 260 and 265 of FIGS. 15 and 16. The graph 260 corresponds to the MEGA1 (10/1)+MEGA6 (2/1)+MEGA1 (10/1) MST layers+290 Å cap with the extended $H_2$ anneals at 1000° C. for 300, 150, and 600 seconds, while the graph 265 corresponds to the MEGA1 (10/1)+MEGA6 (2/1)+MEGA1 (5/1) MST layers+290 Å cap embodiment described above also with extended $H_2$ anneals at 1000° C. for 300, 150, and 600 seconds. The points 261, 266 represent the center MST film oxygen ($^{16}O$) dose losses; the points 262, 267 represent the top MST film oxygen dose losses; the points 263, 268 represent the bottom film oxygen dose losses; and the points 264, 269 represent the total MST film oxygen dose losses. In both cases, the peak oxygen dose still increased after the ten minutes of annealing, and the peak oxygen concentration is changed only slightly.

Turning to the table 270 of FIG. 17, the same process represented in FIG. 14 was performed, but with an even longer 1000° C. anneal to find when the oxygen dose saturates and/or declines. More particularly, this post growth annealing included a first $H_2$ anneal of 300 seconds followed by an $N_2$ anneal of one hour. This resulted in the middle MST film peak oxygen dose increasing by 121% (135% with the nitrogen impurity included).

Turning to the table 272 of FIG. 18, another similar process run was performed but with a series of $H_2$ $N_2$ $H_2$ post growth anneals (MEGA1 (10/1)+MEGA6 (2/1)+MEGA1 (10/1) MST layers+290 Å cap). In particular, one wafer was annealed for 300 seconds at 1000° C. after the $N_2$ anneal, and another wafer was annealed for 120 seconds at 1100° C. after the $N_2$ anneal. These rigorous anneals demonstrated the stability of the middle MST layers, as further demonstrated in the graph 274 of FIG. 19. A stability check of the middle MST layer after the $N_2$ anneal revealed that nitrogen advantageously stabilizes the MST layers for up to a two-minute 1100° C. bake. Further details regarding the use of nitrogen in MST films are provided in co-pending U.S. Pub. No. 2020/0135489, which is assigned to the present Applicant and hereby incorporated herein in its entirety by reference.

In still another example implementation now described with reference to the table 276 of FIG. 20, another similar process run was performed but with an increased middle (MEGA6) oxygen dosage time (MEGA1 (10/1)+MEGA6 (2/1)+MEGA1 (10/1) MST layers+290 Å cap). More particularly, the middle (MEGA6) MST film dose time was increased from the 13 seconds used in the prior examples to 19 seconds. After a 300 second 1000° C. anneal, the middle MST layer dose had increased 120% from the new baseline, or a 155% oxygen increase from the original baseline Run 5063 of 13 seconds. These results are further illustrated in the graph 278 of FIG. 21.

Figure 21:
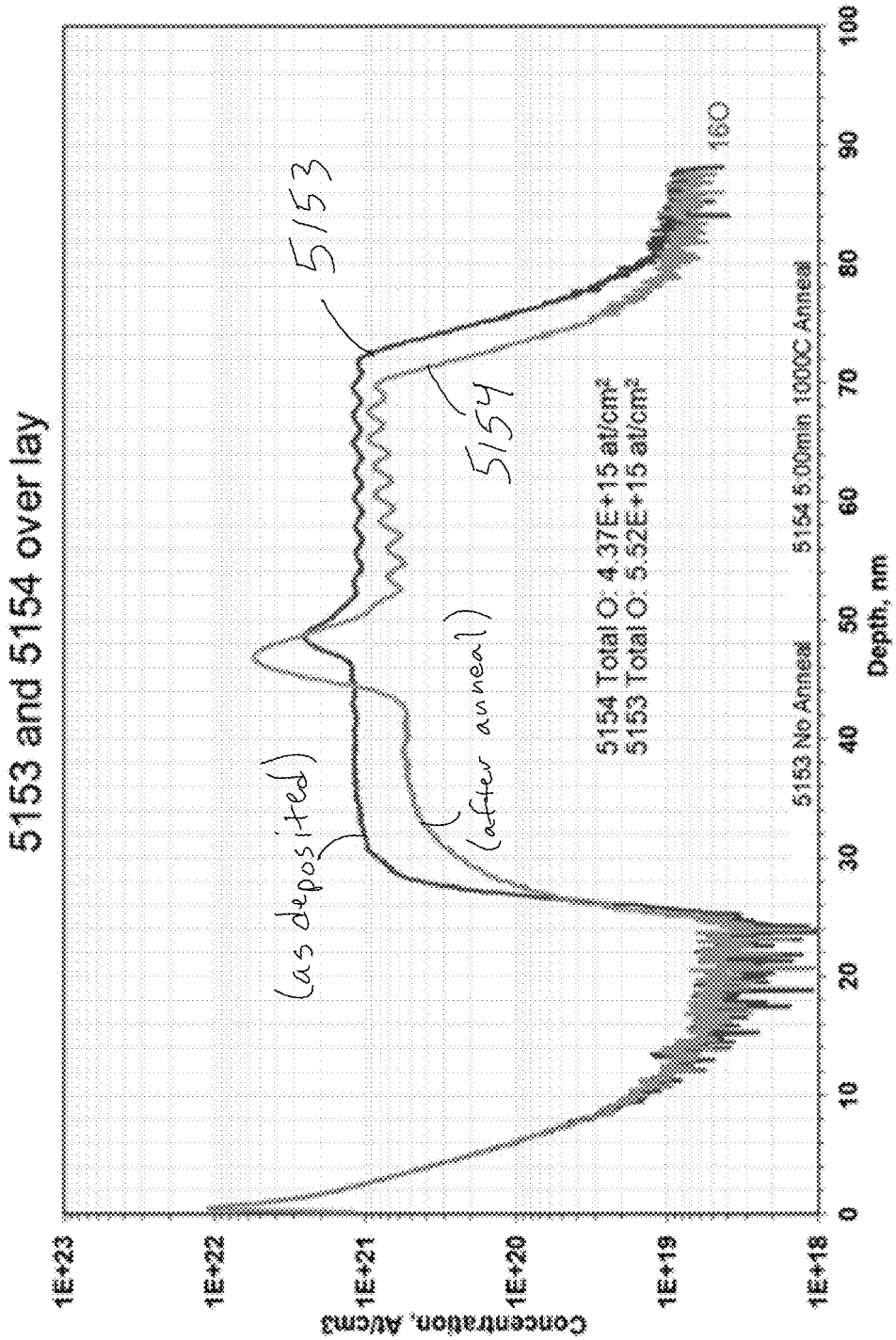
FIG. 21 is a graph of atom concentration vs. depth corresponding to the approach of FIG. 20.
Figure 22:
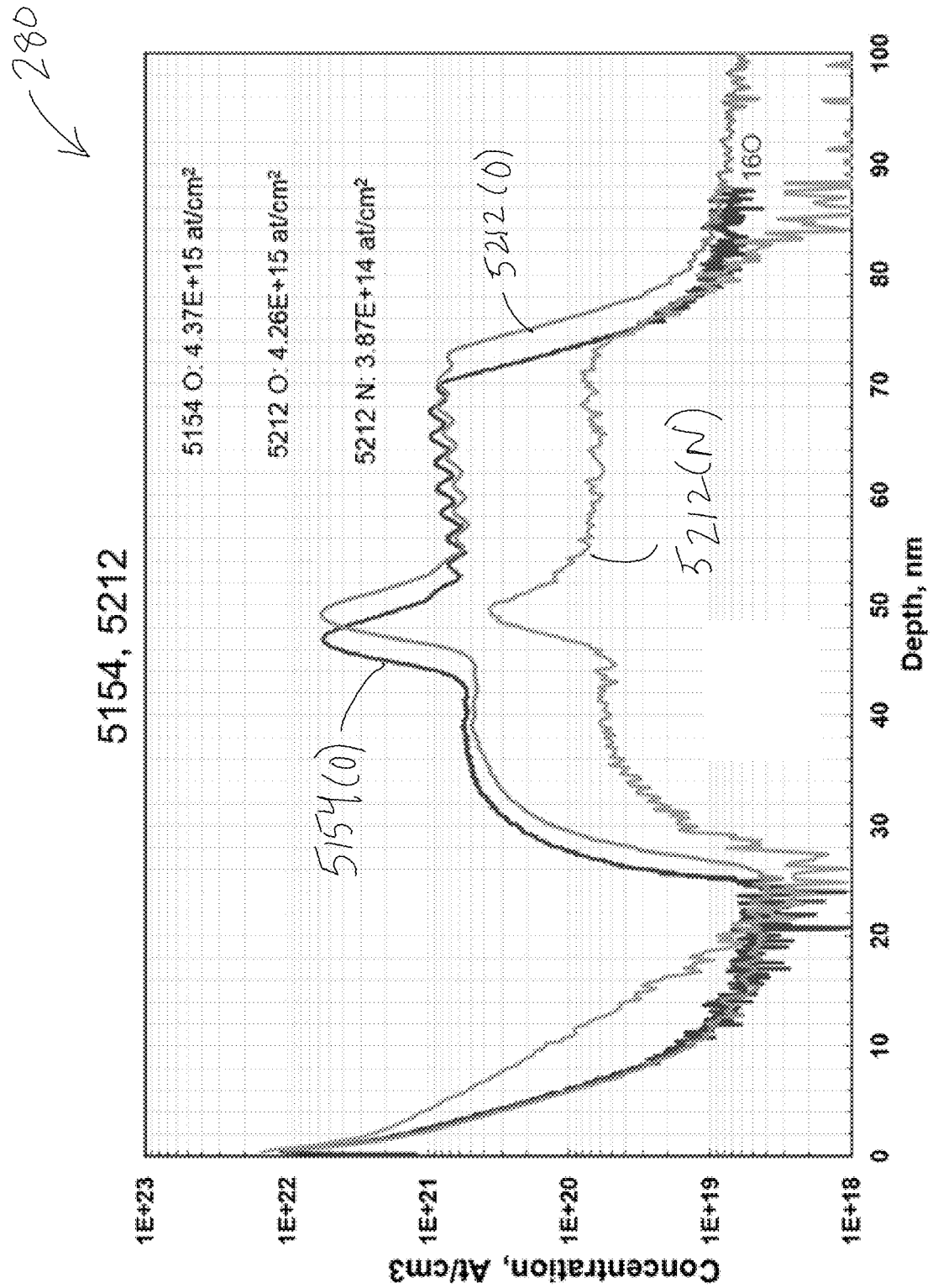
FIG. 22 is a graph of atom concentration vs. depth corresponding to an example implementation of the method of FIG. 7 in which an increased oxygen dosing time and $N_2$ anneal are used.

In yet another example implementation now described with reference to the graph 280 of FIG. 22, another similar process run to that described with respect to FIGS. 20-21 was performed, but with the addition of a post growth anneal in an $N_2$ ambient. After a 300 second 1000° C. anneal, the middle MST layer dose had increased 120% from the new baseline. The $N_2$ anneal had relatively little impact on the total oxygen dose, and a peak oxygen concentration of 5.75E21 atoms/cm$^3$ was achieved (11.5 atomic percent). Thus, it will be appreciated from the illustrated results that the $N_2$ anneal helps stabilize the oxygen atoms in the samples, plus it adds additional impurities for a total of more than twelve atomic percent impurities in the silicon lattice of the middle MST layer.

In summary, the above described processes provide an advantageous approach of forming an epitaxial MST layer with enhanced insulating properties buried within silicon, yet without creating an unmanageable level of defects in the MST layer. By way of example, silicon spacer layers may be between 1 and 30 angstroms, although wider spacings may be used in some embodiments. Dosing of each MST layer may be in a range of ¼ to less than a full monolayer, with less dose per cycle also being useable but potentially requiring more MST donor layers, for example. The arrangement may generally be such that the layers that the oxygen will accumulate on are higher dose and/or more stable. This will help drive the accumulation of the oxygen to the desired targeted region. Moreover, nitrogen may also be used with the above described processes, and in the examples it was utilized via a post growth hydrogen anneal. One could also use nitric (NO) or Hydrazine ($H_4N_2$) to form monolayers of nitrogen and/or nitrogen and oxygen. The temperature range of growth for the MST layers advantageously need not be changed from prior process flows, and anneal temperatures may be in the 700° C. and 1100° C. range, and more particularly 900° C. to 1000° C., for example. Laser annealing, as well as rapid thermal processing (RTP) or very fast spike anneals to 900° C. to 1200° C., may also be used in some embodiments.

The above-described example film stacks were all built around 10/1+2/1+10/1 (MEGA1+MEGA6+MEGA1) or 10/1+2/1+5/1 layer configurations. However, one of ordinary skill in the art will appreciate that other combinations of layers or layer types may also be used. Enhanced oxygen MST films may also be formed using an oxygen+carbon/carbon-oxygen configuration, which is described further in Applicant's co-pending application filed Jul. 2, 2021, which is hereby incorporated herein in its entirety by reference. In other example implementations, $^{28}Si$ and/or $^{18}O$ materials may also be incorporated in enhanced oxygen MST films, as respectively described further in co-pending U.S. application Ser. Nos. 17/236,329 and 17/236,289 filed Apr. 21, 2021, and U.S. application Ser. Nos. 17/330,860 and 17/330,831 filed May 26, 2021, all of which are assigned to the present Applicant and are hereby incorporated herein in their entireties by reference.

By way of example, applications for oxygen enriched MST layers formed according to the above-described approach may include but are not limited to: SOI (Silicon on Insulator); localized, in-situ insulators to reduce parasitic capacitance between neighboring devices; resonance tunneling diodes (RTDs); etch stops; 3D devices (e.g., FINFETs) above and below the enhanced oxygen layers; deep junction control; contamination gettering metals and dopants (e.g., dopant blocking); mobility enhancement; and epitaxial resistors.

Figure 23:
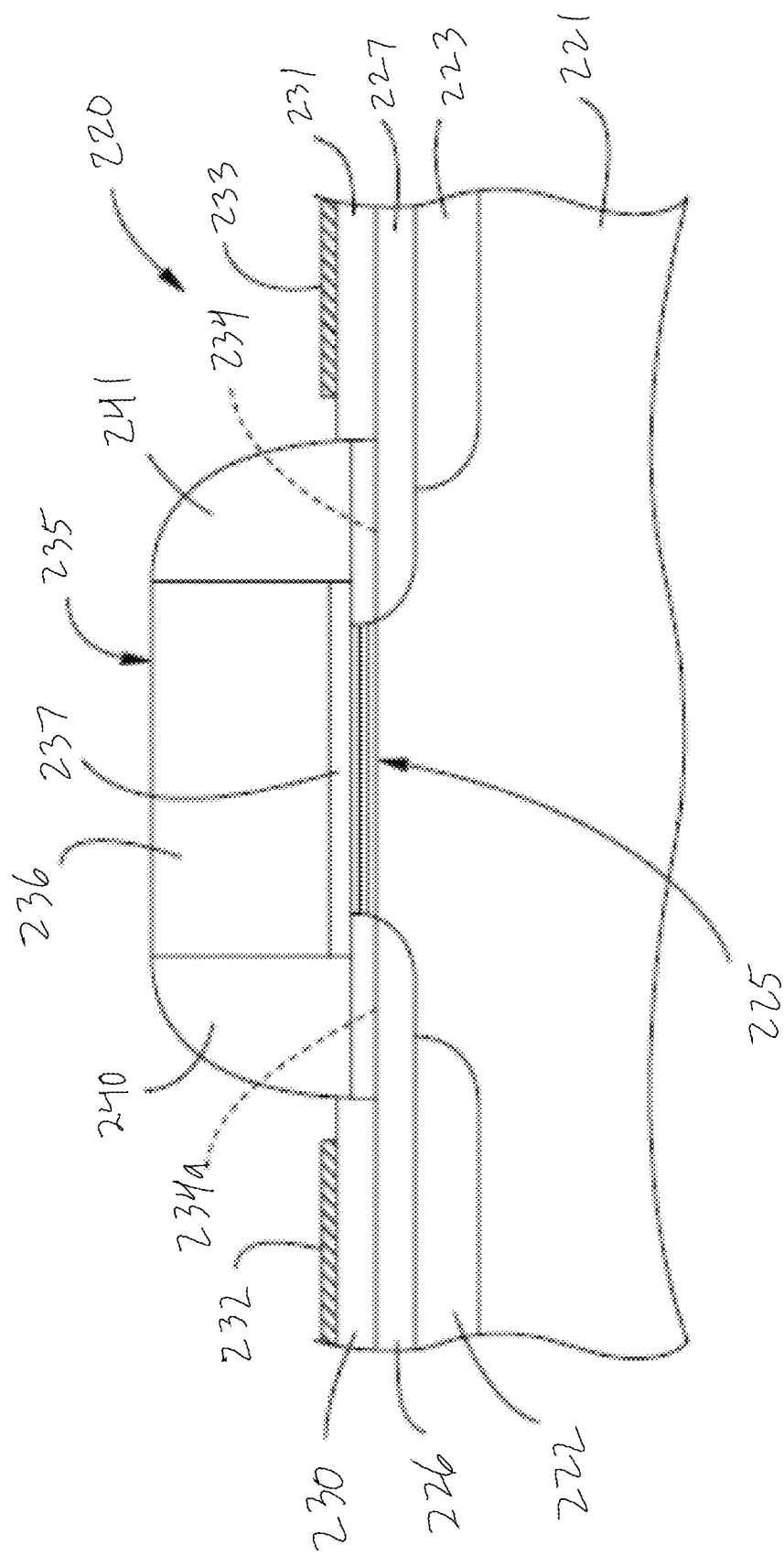
FIG. 23 is a schematic cross-sectional view of a semiconductor device including a superlattice channel fabricated in accordance with the method of FIG. 7.

More particularly, one example semiconductor device (MOSFET) 220 in which an enhanced oxygen superlattice 225 formed according to the above-described approach may be incorporated is now described with reference to FIG. 23. The illustrated MOSFET 220 includes a substrate 221, source/drain regions 222, 223, source/drain extensions 226, 227, and a channel region therebetween provided by an oxygen and carbon/carbon-oxygen superlattice 225. The channel may be formed partially or completely within the superlattice 225. Source/drain silicide layers 230, 231 and source/drain contacts 232, 233 overlie the source/drain regions as will be appreciated by those skilled in the art. Regions indicated by dashed lines 234a, 234b are optional vestigial portions formed originally with the superlattice 225, but thereafter heavily doped. In other embodiments, these vestigial superlattice regions 234a, 234b may not be present, as will also be appreciated by those skilled in the art. A gate 235 illustratively includes a gate insulating layer 237 adjacent the channel provided by the superlattice 225, and a gate electrode layer 236 on the gate insulating layer. Sidewall spacers 240, 241 are also provided in the illustrated MOSFET 220.

Figure 24:
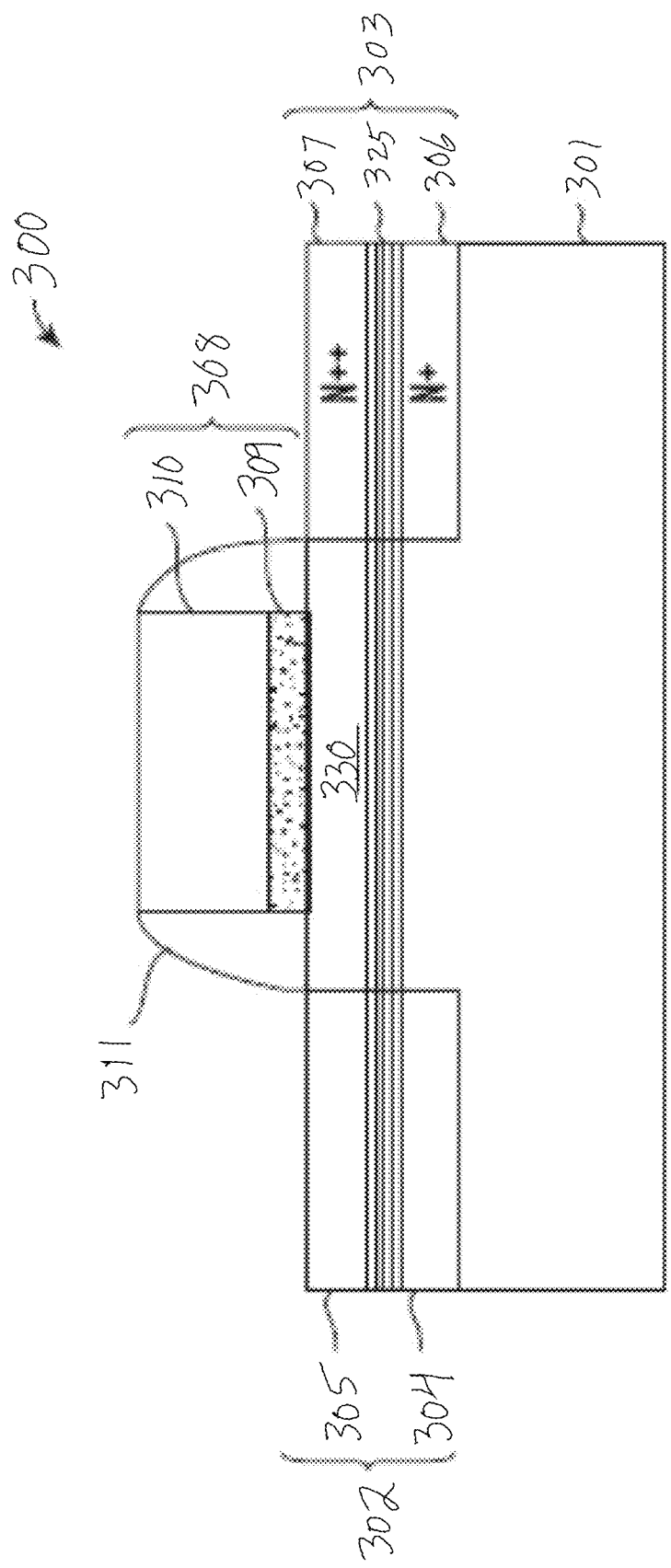
FIG. 24 is a schematic cross-sectional view of a semiconductor device including a superlattice fabricated in accordance with the method of FIG. 7 and dividing a semiconductor layer into regions having a same conductivity type and different dopant concentrations.
Figure 25:
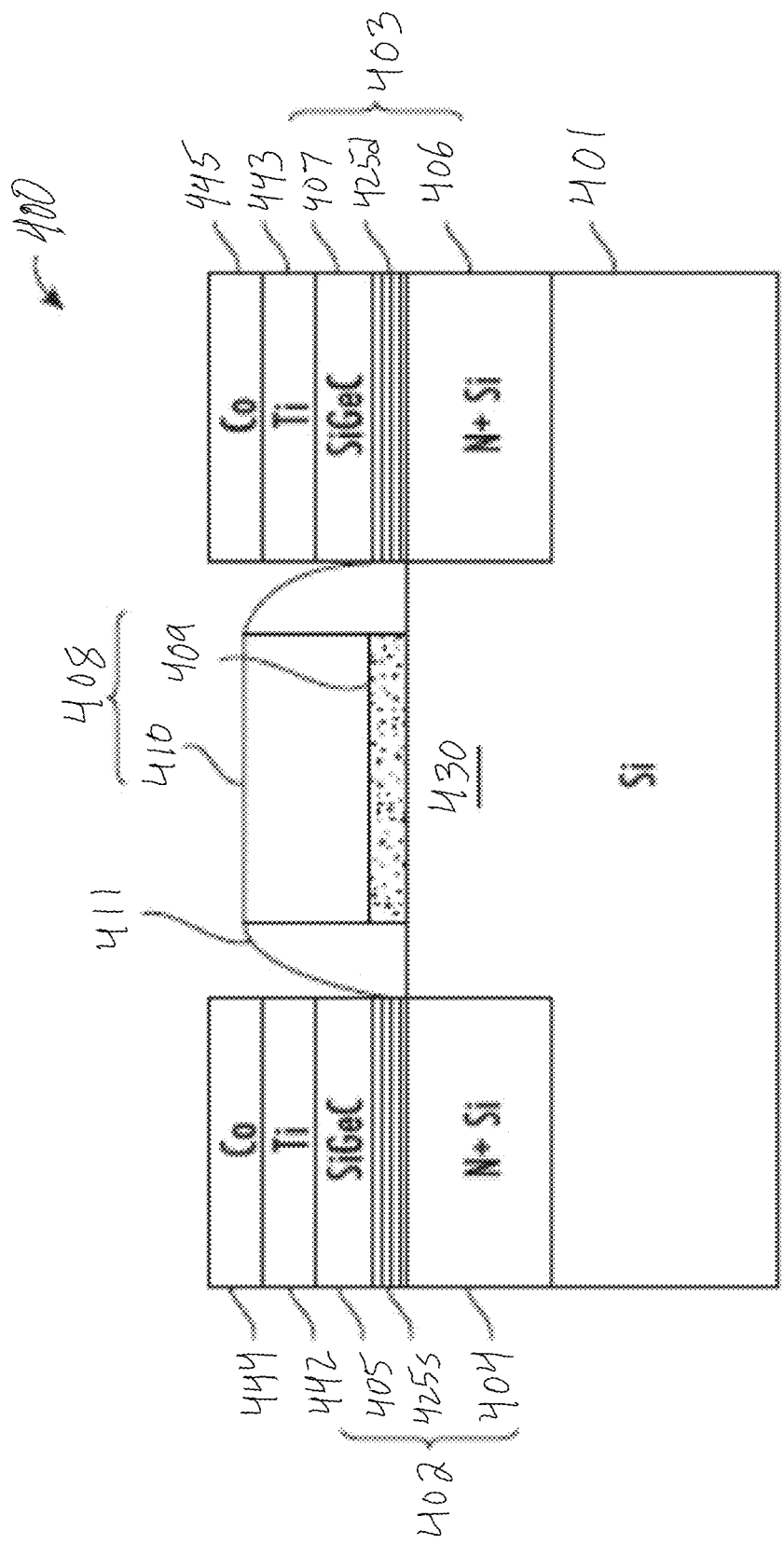
FIG. 25 is a schematic cross-sectional view of a semiconductor device including a superlattice fabricated in accordance with the method of FIG. 7 and a metal contact layer above the superlattice.

Referring additionally to FIG. 24, in accordance with another example of a device in which an enhanced oxygen superlattice 325 formed according to the above-described approach may be incorporated is a semiconductor device 300, where the superlattice is used as a dopant diffusion blocking superlattice to advantageously increase surface dopant concentration to allow a higher $N_D$ (active dopant concentration at metal/semiconductor interface) during in-situ doped epitaxial processing by preventing diffusion into a channel region 330 of the device. More particularly, the device 300 illustratively includes a semiconductor layer or substrate 301, and spaced apart source and drain regions 302, 303 formed in the semiconductor layer with the channel region 330 extending therebetween. The dopant diffusion blocking superlattice 325 illustratively extends through the source region 302 to divide the source region into a lower source region 304 and an upper source region 305, and also extends through the drain region 303 to divide the drain region into a lower drain region 306 and an upper drain region 307.

The dopant diffusion blocking superlattice 325 may also conceptually be considered as a source dopant blocking superlattice within the source region 302, a drain dopant blocking superlattice within the drain region 303, and a body dopant blocking superlattice beneath the channel 330, although in this configuration all three of these are provided by a single blanket deposition of the MST material across the substrate 301 as a continuous film. The semiconductor material above the dopant blocking superlattice 325 in which the upper source/drain regions 305, 307 and channel region 330 are defined may be epitaxially grown on the dopant blocking superlattice 325 either as a thick superlattice cap layer or bulk semiconductor layer, for example. In the illustrated example, the upper source/drain regions 305, 307 may each be level with an upper surface of this semiconductor layer (i.e., they are implanted within this layer).

As such, the upper source/drain regions 305, 307 may advantageously have a same conductivity as the lower source/drain regions 304, 306, yet with a higher dopant concentration. In the illustrated example, the upper source/drain regions 305, 307 and the lower source/drain regions 304, 306 are N-type for a N-channel device, but these regions may also be P-type for a P-channel device as well. Surface dopant may be introduced by ion implantation, for example. Yet, the dopant diffusion is reduced by the MST film material of the diffusion blocking superlattice 325 because it traps point defects/interstitials introduced by ion implantation which mediate dopant diffusion.

The semiconductor device 300 further illustratively includes a gate 308 on the channel region 330. The gate illustratively includes a gate insulating layer 309 gate electrode 310. Sidewall spacers 311 are also provided in the illustrated example. Further details regarding the device 300, as well as other similar structures in which an oxygen enhanced superlattice may be used, are set forth in U.S. Pat. No. 10,818,755 to Takeuchi et al., which is assigned to the present Applicant and hereby incorporated herein in its entirety by reference.

Turning to FIG. 24, another example embodiment of a semiconductor device 400 in which an enhanced oxygen superlattice 325 formed according to the above-described approach may be used is now described. More particularly, in the illustrated example both source and drain dopant diffusion blocking superlattices 425s, 425d advantageously provide for Schottky barrier height modulation via heteroepitaxial film integration. More particularly, the lower source and drain regions 404, 406 include a different material than the upper source and drain regions 405, 407. In this example, the lower source and drain regions 404, 40l are silicon, and the upper source and drain regions 405, 407 are SiGeC, although different materials may be used in different embodiments. Lower metal layers (Ti) 442, 443 are formed on the upper source and drain regions (SiGeC layers) 405, 407. Upper metal layers (Co) 444, 445 are formed on the lower metal layers 442, 443, respectively. Because the MST material is effective in integrating hetero-epitaxial semiconductor material, incorporation of C(1-2%) to Si or SiGe on Si may induce a positive conduction band offset. More particularly, this is a SiGeC/MST/n+ Si structure that is effective for reducing Schottky barrier height. Further details regarding the device 400 are set forth in the above-noted '755 patent.

Moreover, an important process step in the fabrication of many semiconductor devices is to perform an etch. In some cases it is important for the etch to be uniform, but in other cases it is desirable for an etch to be selective, or to stop at a particular depth. One example is in the formation of gate-all-around (GAA) devices, where commonly a stack of alternating silicon (Si) and silicon germanium (SiGe) is grown such that later in the process the SiGe may be selectively etched to leave only the silicon, prior to forming a gate around the silicon. Example GAA devices in which enhanced oxygen superlattices may be incorporated are set forth in the above-noted co-pending application. Enhanced oxygen superlattices may also be used in other devices, e.g., certain image sensor or RF devices where it is desirable to remove the silicon underneath the device of interest, or to etch silicon to a particular depth. There are many more examples that would be familiar to one skilled in the art.

Typical MST silicon recipes are such that the etch rate is very similar to regular silicon. However, the enhanced oxygen MST films described herein may have significantly different etch rates to regular silicon, such that these films can be used in selective etch, or etch stop applications. It is also expected that the incorporation of other elements into the film may facilitate achieving a "signal" that could be used to indicate an end point for a given etch, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A method for making a semiconductor device comprising:
    forming first and second superlattices adjacent a semiconductor layer and each comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, the second superlattice having a greater thermal stability with respect to thermally induced migration of non-semiconductor atoms from positions within the second superlattice than thermally induced migration of non-semiconductor atoms from positions within the first superlattice; and
    heating the first and second superlattices to cause non-semiconductor atoms from the first superlattice to migrate toward the at least one non-semiconductor monolayer of the second superlattice.

2. The method of claim 1 wherein the first superlattice is below the second superlattice; and further comprising forming a third superlattice above the second superlattice and comprising a plurality of stacked groups of layers with each group of layers comprising a plurality of stacked base semiconductor monolayers defining a base semiconductor portion and at least one non-semiconductor monolayer constrained within a crystal lattice of adjacent base semiconductor portions; wherein the second superlattice has a greater thermal stability with respect to non-semiconductor atoms than the third superlattice.

3. The method of claim 1 further comprising forming a semiconductor layer above the first and second superlattices at a temperature of at least 1000° C. and for a time period of at least thirty seconds.

4. The method of claim 3 wherein the semiconductor layer has a thickness of at least 500 nm.

5. The method of claim 1 wherein forming the second superlattice comprises forming the second superlattice at a temperature above 600° C.

6. The method of claim 1 wherein forming the first superlattice comprises forming the first superlattice at a temperature below 600° C.

7. The method of claim 1 further comprising forming a semiconductor cap layer above the first and second superlattices.

8. The method of claim 1 wherein heating comprises annealing in an ambient comprising one or more of the group of hydrogen, nitrogen, helium, and argon.

9. The method of claim 1 wherein the at least one non-semiconductor monolayer of the first and second superlattices comprises oxygen.

10. The method of claim 1 wherein the base semiconductor layers of the first and second superlattices comprise silicon.

11. A method for making a semiconductor device comprising:
    forming first and second superlattices adjacent a semiconductor layer and each comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, the second superlattice having a greater thermal stability with respect to thermally induced migration of non-semiconductor atoms from positions within the second superlattice than thermally induced migration of non-semiconductor atoms from positions within the first superlattice; and
    heating the first and second superlattices to cause non-semiconductor atoms from the first superlattice to migrate toward the at least one non-semiconductor monolayer of the second superlattice;
    wherein forming the second superlattice comprises forming the second superlattice at a temperature above 600° C., and forming the first superlattice comprises forming the first superlattice at a temperature below 600° C.

12. The method of claim 11 wherein the first superlattice is below the second superlattice; and further comprising forming a third superlattice above the second superlattice and comprising a plurality of stacked groups of layers with each group of layers comprising a plurality of stacked base semiconductor monolayers defining a base semiconductor portion and at least one non-semiconductor monolayer constrained within a crystal lattice of adjacent base semiconductor portions; and wherein the second superlattice has a greater thermal stability with respect to non-semiconductor atoms than the third superlattice.

13. The method of claim 11 further comprising forming a semiconductor layer above the first and second superlattices at a temperature of at least 1000° C. and for a time period of at least thirty seconds.

14. The method of claim 13 wherein the semiconductor layer has a thickness of at least 500 nm.

15. The method of claim 11 further comprising forming a semiconductor cap layer above the first and second superlattices.

16. The method of claim 11 wherein heating comprises annealing in an ambient comprising one or more of the group of hydrogen, nitrogen, helium, and argon.

* * * * *